US008602593B2

(12) United States Patent
Markle et al.

(10) Patent No.: US 8,602,593 B2
(45) Date of Patent: Dec. 10, 2013

(54) LAMP ASSEMBLIES AND METHODS OF MAKING THE SAME

(75) Inventors: Joshua Josiah Markle, Raleigh, NC (US); Robert Edward Higley, Cary, NC (US)

(73) Assignee: Cree, Inc., Durham, NC (US)

( * ) Notice: Subject to any disclaimer, the term of this patent is extended or adjusted under 35 U.S.C. 154(b) by 810 days.

(21) Appl. No.: 12/579,946

(22) Filed: Oct. 15, 2009

(65) Prior Publication Data

US 2011/0090691 A1 Apr. 21, 2011

(51) Int. Cl.
*F21V 21/00* (2006.01)
(52) U.S. Cl.
USPC ............... 362/249.02; 362/294; 362/373
(58) Field of Classification Search
USPC ............ 362/249.02, 294, 373, 235, 800; 313/512
See application file for complete search history.

(56) References Cited

U.S. PATENT DOCUMENTS

| | | | | |
|---|---|---|---|---|
| 5,606,358 | A * | 2/1997 | Beaman | 347/237 |
| 5,857,767 | A * | 1/1999 | Hochstein | 362/294 |
| 6,999,318 | B2 * | 2/2006 | Newby | 361/719 |
| 7,044,620 | B2 | 5/2006 | Van Duyn | |
| 7,213,940 | B1 * | 5/2007 | Van De Ven et al. | 362/231 |
| 7,549,786 | B2 | 6/2009 | Higley et al. | |
| 7,654,688 | B2 * | 2/2010 | Li et al. | 362/240 |
| 8,016,469 | B2 * | 9/2011 | Takeda et al. | 362/543 |
| 8,029,155 | B2 * | 10/2011 | Van De Ven et al. | 362/231 |
| 8,038,317 | B2 * | 10/2011 | Van De Ven et al. | 362/231 |
| 8,197,100 | B2 * | 6/2012 | Kim | 362/294 |
| 8,342,734 | B2 * | 1/2013 | Ohmi et al. | 362/657 |
| 2005/0077616 | A1 * | 4/2005 | Ng et al. | 257/707 |
| 2005/0279949 | A1 * | 12/2005 | Oldham et al. | 250/458.1 |
| 2006/0001361 | A1 | 1/2006 | Imai et al. | |
| 2006/0197101 | A1 | 9/2006 | Wu | |
| 2006/0279962 | A1 | 12/2006 | Loh | |
| 2006/0292747 | A1 | 12/2006 | Loh | |
| 2007/0063209 | A1 * | 3/2007 | Sugiura et al. | 257/98 |
| 2008/0128739 | A1 * | 6/2008 | Sanpei et al. | 257/99 |
| 2008/0130275 | A1 * | 6/2008 | Higley et al. | 362/184 |
| 2008/0130288 | A1 * | 6/2008 | Catalano et al. | 362/294 |
| 2009/0026485 | A1 * | 1/2009 | Urano et al. | 257/99 |
| 2009/0046456 | A1 | 2/2009 | Urano et al. | |
| 2009/0154160 | A1 | 6/2009 | Li et al. | |
| 2010/0177519 | A1 * | 7/2010 | Schlitz | 362/294 |

OTHER PUBLICATIONS

Gregory S. Bibee, U.S. Appl. No. 12/574,918 entitled "Methods and Apparatus for Mounting and Electrical Connection," filed Oct. 7, 2009.
International Search Report and Written Opinion for PCT/US2010/048769 dated Nov. 3, 2010.

* cited by examiner

*Primary Examiner* — John A Ward
(74) *Attorney, Agent, or Firm* — Jenkins, Wilson, Taylor & Hunt, P.A.

(57) ABSTRACT

Lamp assemblies and methods of making the same are provided. Such a lamp assembly can include a heat sink and a light-emitting diode package that can be mounted to the heat sink. The light-emitting diode package can include a substrate with a top surface and bottom surface, a lens, and electrical contacts on the surface of the substrate. The lamp assembly can also include a printed circuit board with a face surface, a rear surface opposite the face surface and an opening extending from the face surface to the rear surface. The printed circuit board can have electrical contacts thereon for electrical connection with the electrical contacts of the light-emitting diode package. The substrate of the light-emitting diode package can engage the opening of the printed circuit board to mechanically couple the light-emitting diode package to the printed circuit board. When assembled, a bottom surface of the substrate can be flush and aligned with a rear surface of the printed circuit board.

43 Claims, 18 Drawing Sheets

LAMP ASSEMBLIES AND METHODS OF MAKING THE SAME

TECHNICAL FIELD

The present subject matter generally relates to lamp assemblies. More particularly, the present subject matter relates to lamp assemblies that include a light-emitting diode package mechanically connected to a printed circuit board.

BACKGROUND

Solid-state lighting is becoming increasingly important in the lighting industry. Solid-state lighting refers to a type of lighting that uses semiconductor light-emitting diodes, organic light-emitting diodes, or polymer light-emitting diodes as sources of illumination rather than electrical filaments, plasma (used in arc lamps such as fluorescent lamps), or gas.

Various implementations of light-emitting diode lighting fixtures are becoming available in the marketplace to fill a wide range of applications. Such different lighting application in which light-emitting diodes can be used include domestic lighting, billboard and display lighting, automotive and bicycle lighting, emergency lighting, traffic and railway lighting, and floodlight and flashlight use. Light-emitting diodes are smaller than incandescent bulbs and use less energy. In addition, light-emitting diodes have a longer life than standard incandescent light bulbs. Accordingly, the use of light-emitting diodes in lighting applications can provide significant energy savings, increased lamp life, smaller lamp size, and flexibility in the design. For these reasons, lighting manufacturers are increasingly interested in unique lighting fixtures incorporating light-emitting diodes that may also have appeal to their intended customers.

While providing many benefits, light-emitting diode lighting fixtures can still be time consuming to manufacture and can therefore be expensive. Additionally, the use of solder in the manufacturing process can raise cost and safety concerns. Further, heat dissipation has to be addressed with light-emitting diodes.

SUMMARY

In accordance with this disclosure, lamp assemblies that can be easily assembled and provide a sturdy durable construction are provided. It is, therefore, an object of the present disclosure to provide lamp assemblies that include light-emitting diode packages that are mechanically coupled to printed circuit boards.

This and other objects of the present disclosure as can become apparent from the present disclosure are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
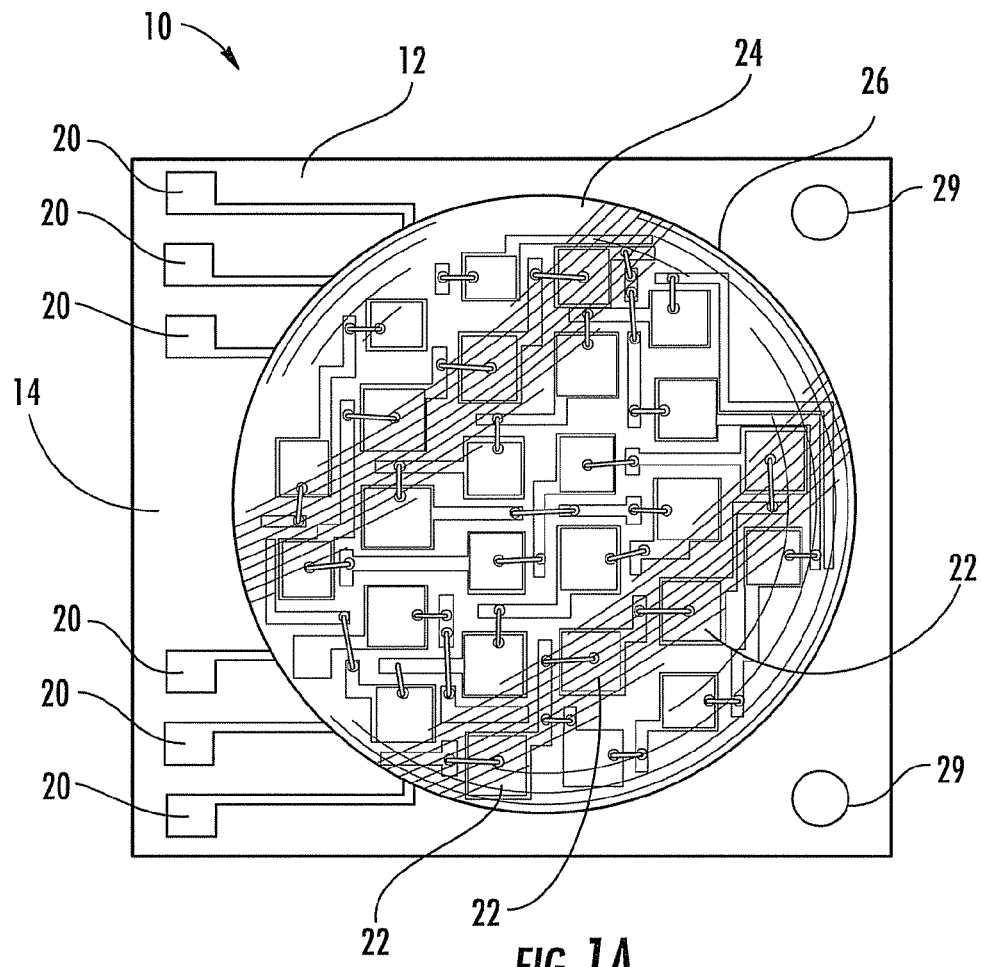
FIG. 1A illustrates a top view of an embodiment of a light-emitting diode package that can be included in lamp assemblies according to the present subject matter.

Reference will now be made in detail to possible embodiments of the present subject matter, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the Figures, some sizes of structures or portions are exaggerated relative to other structures or portions for illustrative purposes and, thus, are provided to illustrate the general structures of the present invention. Furthermore, various aspects of the present invention are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion.

Furthermore, relative terms such as "on" or "above" are used herein to describe one structure's or portion's relationship to another structure or portion as illustrated in the figures. It will be understood that relative terms such as "on" or "above" are intended to encompass different orientations of the device in addition to the orientation depicted in the figures. For example, if the device in the figures is turned over, structure or portion described as "above" other structures or portions would now be oriented "below" the other structures or portions. Likewise, if the device in the figures is rotated along an axis, stricture or portion described as "above", other structures or portions would now be oriented "next to" or "left of" the other structures or portions. Like numbers refer to like elements throughout.

Lamp assemblies and methods of making the same are disclosed herein. Generally, a lamp assembly can be provided that includes a heat sink and a light-emitting diode package that can be mounted or attached to the heat sink. The light-emitting diode package can include a substrate having a top surface and bottom surface with electrical contacts on the substrate. The top surface can include one or more light-emitting diode chips electrically connected to the electrical contacts that are encompassed with a lens. The lamp assembly can also include a printed circuit board having a face surface, a rear surface opposite the face surface and an opening extending from the rear surface to the face surface. The printed circuit board can have electrical contacts thereon for electrical connection with the electrical contacts of the light-emitting diode package. The substrate of the light-emitting diode package can engage the opening of the printed circuit board to provide a mechanical coupling of the light-emitting diode package to the printed circuit board. This can provide for a solderless electrical connection.

Figure 1B:
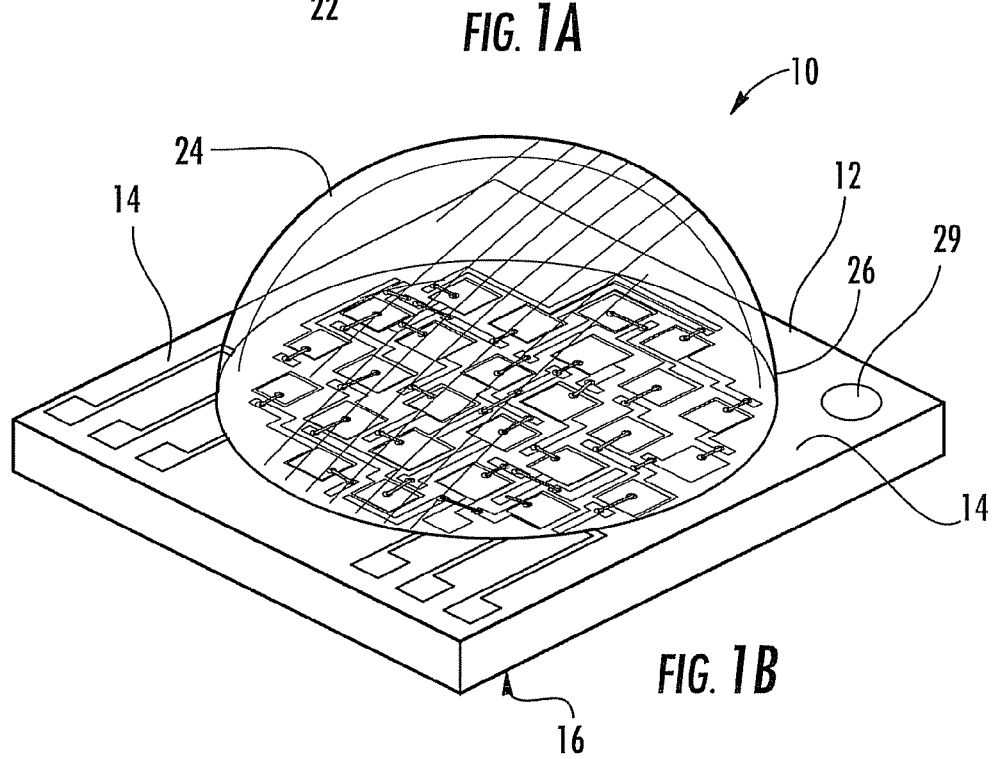
FIG. 1B illustrates a perspective view of the embodiment of the light-emitting diode package shown in FIG. 1A.

FIGS. 1A and 1B illustrate a light-emitting diode package 10 that can be used in the lamp assemblies disclosed herein. The light-emitting diode package 10 includes a substrate 12 having a top surface 14 and bottom surface 16. Substrate 12 can be a material such as, for example, silicon, copper, silver, FR4, aluminum, thermally conductive polycarbonate, or other suitable material. Substrate 12 may be formed of many different materials, including electrically insulating materials. Suitable substrate materials also can include, but are not limited to, ceramic materials such as aluminum nitride (AlN) and alumina ($Al_2O_3$). Dimensions of substrate 12 can vary widely depending on the applications and processes used to manufacture light-emitting diode package 10 and the lamp assembly in which it is used.

The light-emitting diode package 10 can include electrical contacts 20. In one aspect, electrical contacts 20 can be disposed only on the top surface 14 of the substrate 12. For example, electrical contacts 20 can be electrically connected to one or more light-emitting diode chips 22 (see FIG. 1A) in a known manner as understood by one of ordinary skill in the art. In the embodiment shown in FIGS. 1A and 1B, six electrical contacts 20 are shown. The number of electrical contacts 20 can vary and can be dependent upon the number of light-emitting diode chips 22 used in the light-emitting diode package 10. The number of light-emitting diode chips 22 can, for example, vary between about 1 to about 25 or more for a given package size. More light-emitting diode chips such as chips 22 can be included in larger package sizes. The light-emitting diode chips 22 can be connected in series. For example, alternating lines of red light producing light-emitting diode chips 22 and white light producing light-emitting diode chips 22 can be used in the light-emitting diode package 10. Thus, the manner in which the light-emitting diode chips 22 are connected can also affect the number of electrical contacts 20 in the light-emitting diode package 10.

By having the electrical contacts 20 only on the top surface 14 of the substrate 12 as shown in one aspect, light-emitting diode package 10 can be formed on a larger wafer of the substrate material with the wafer being cut into individual light-emitting diode packages 10 with substrate 12 having sides 28. While the substrate 12 is shown to have a rectangular plan view shape, the substrate can vary in size and shape. The top surface 14 can also include markers 29 that can aid a user in determining the orientation of the light-emitting diode package 10 when being installed.

The light-emitting diode chips 22 can be covered by a lens 24. The lens 24 can be formed of different material. For example, encapsulation material can be used to encapsulate the light-emitting diode chips 22 and their associated bonding wires and mounting pads in a compression mounting process to form the lens 24. Other lens material can be used. In the embodiment shown, the lens 24 is formed into a domed shape. The dome shape of the lens 24 can be generally a hemispherical shape with the base 26 of the lens 24 having the greatest diameter. Other lens shapes that have a base can be used.

The light-emitting diode package 10 shown in FIGS. 1A and 1B or similar light-emitting diode packages with electrical contacts on the top surface of the substrate can be used in the lamp assemblies shown in FIGS. 2A-9B.

Figure 2A:
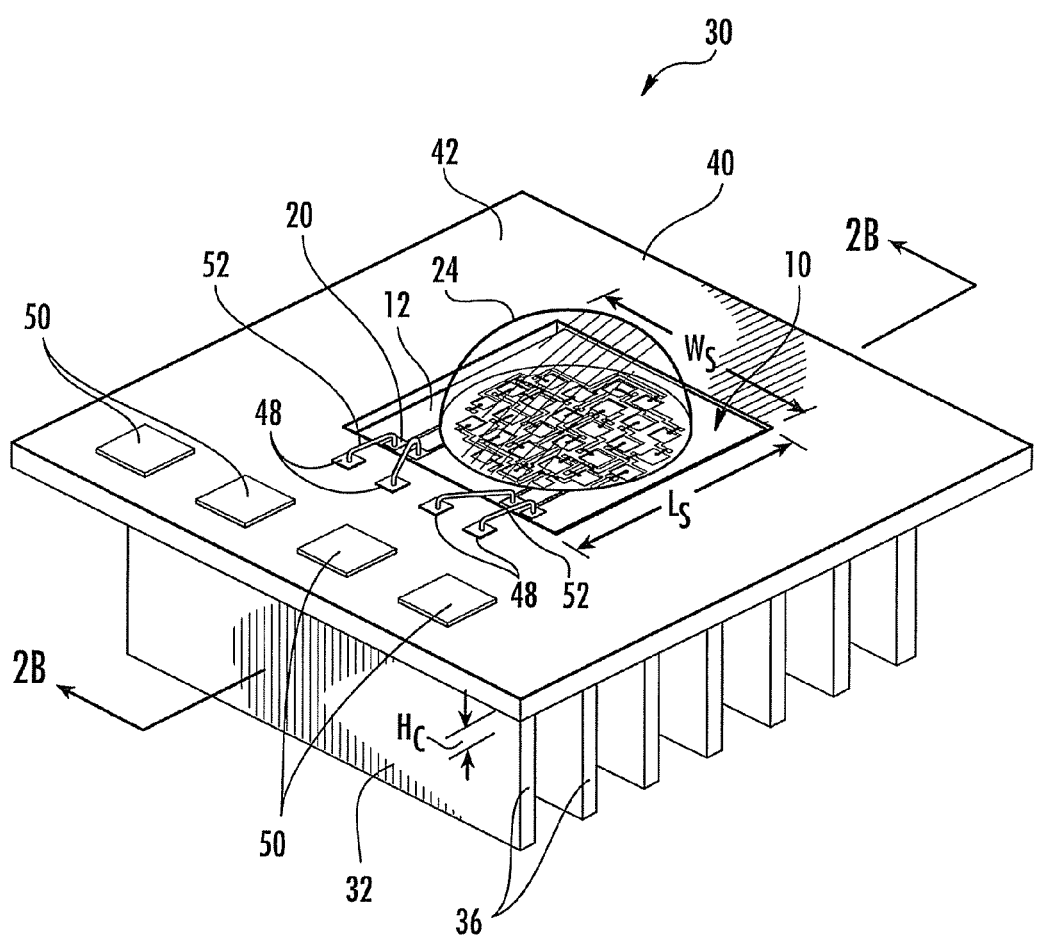
FIG. 2A illustrates a perspective view of an embodiment of a lamp assembly according to the present subject matter.
Figure 2B:
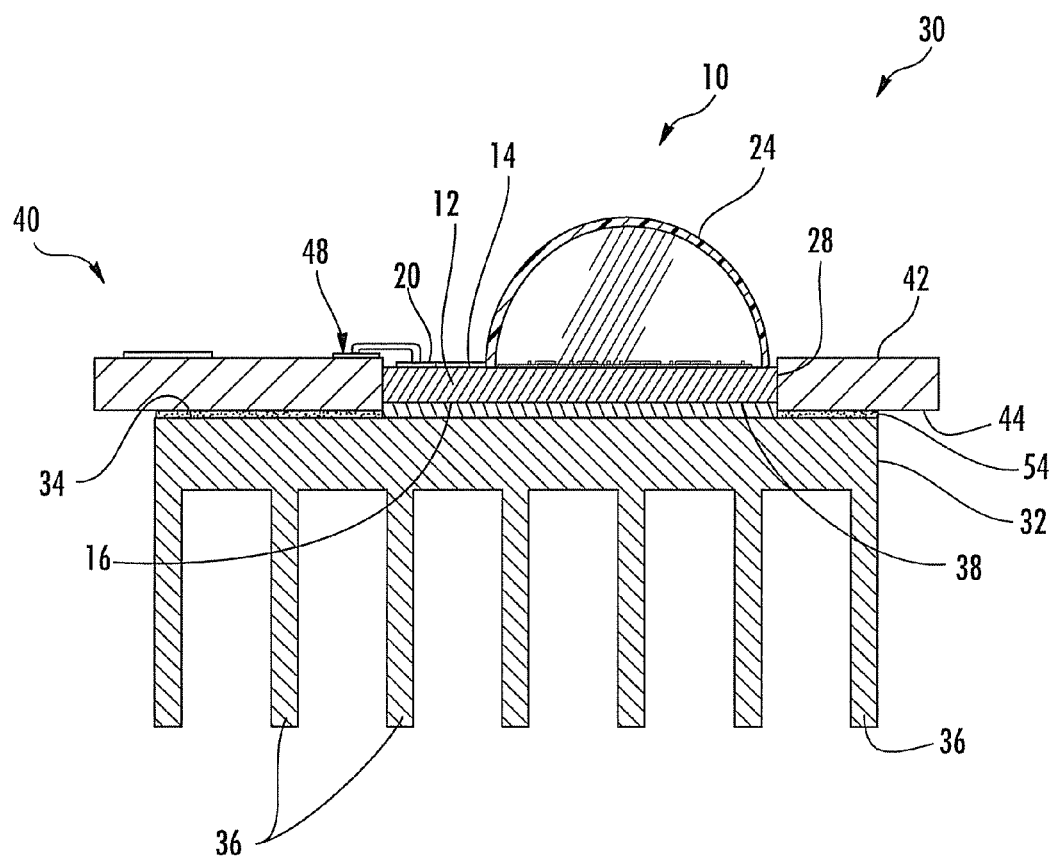
FIG. 2B illustrates a vertical cross-sectional view of the embodiment of the lamp assembly shown in FIG. 2A taken along the lines 2B-2B.
Figure 2C:
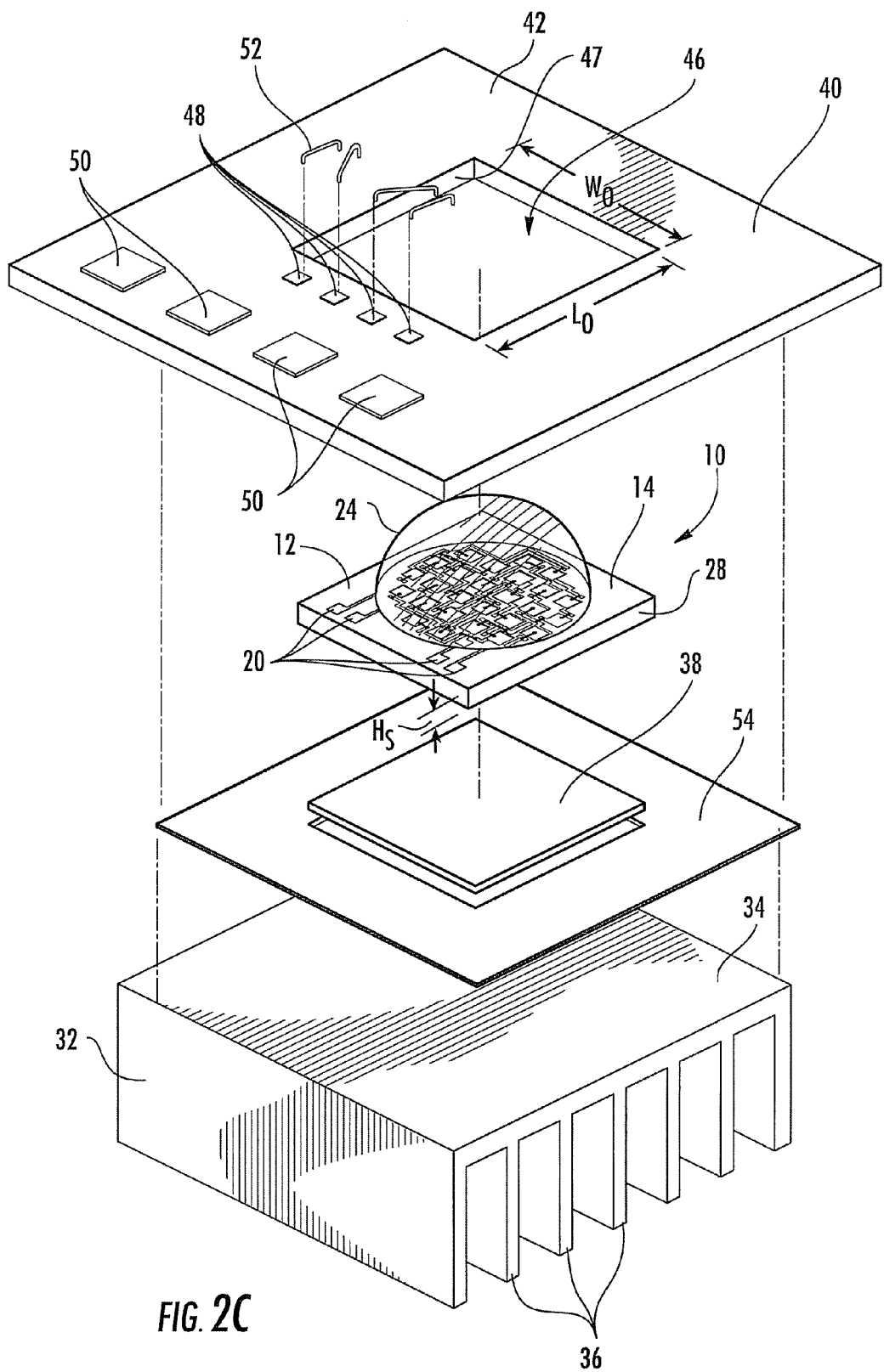
FIG. 2C illustrates an exploded view of the embodiment of the lamp assembly shown in FIG. 2A.

As shown in FIGS. 2A-2C, a lamp assembly 30 can include a light-emitting diode, such as light-emitting diode package 10 mounted on a heat sink 32 and a board 40 that can be a printed circuit board. The heat sink 32 can include a top surface 34 on which the light-emitting diode package 10 can be secured. The heat sink 32 can also include fins 36 to facilitate heat dissipation. The fins 36 can be spaced apart to facilitate air flow around the fins 36. The light-emitting diode package 10 can be mounted on and secured to the heat sink 32 in different ways. For example, the substrate 12 of the light-emitting diode package 10 can be directly mounted on the heat sink 32. In this regard, substrate 12 can be mounted to the heat sink 32 with a thermally conductive compound 38. By directly mounting the light-emitting diode package 10 to the heat sink 32 using the thermally conductive compound 38, thermal transfer can occur that moves heat away from the light-emitting diode package 10 and the printed circuit board 40 without having to transfer the heat through the printed circuit board 40. Having the electrical contacts 20 on the top surface 14 of the substrate 12 and directly mounting the light-emitting diode package 10 to the heat sink 32 can also increase the manufacturability of the lamp assembly 30. Additionally, light-emitting diode package 10 can be mounted directly on and secured to the heat sink 32 without a substrate.

The printed circuit board 40 can have a face surface 42 and a rear surface 44 (see FIG. 2B) opposite the face surface 42. The printed circuit board 40 can be made of different material. For example, the printed circuit board 40 can be, but is not limited to ceramic, metal core, laminate, for example, FR-4, or the like. Generally, the printed circuit board 40 can be rigid or semi-rigid in nature. The printed circuit board 40 can define an opening 46 that extends from the rear surface 44 to the face surface 42. The opening 46 can be defined by inner walls 47. The printed circuit board 40 can also include electrical contacts 48 thereon. Further, the printed circuit board 40 can include large contacts 50, for example, solder pads, for connecting the lamp assembly 30 to the housing or lighting fixture in which it will be used.

Figure 3:
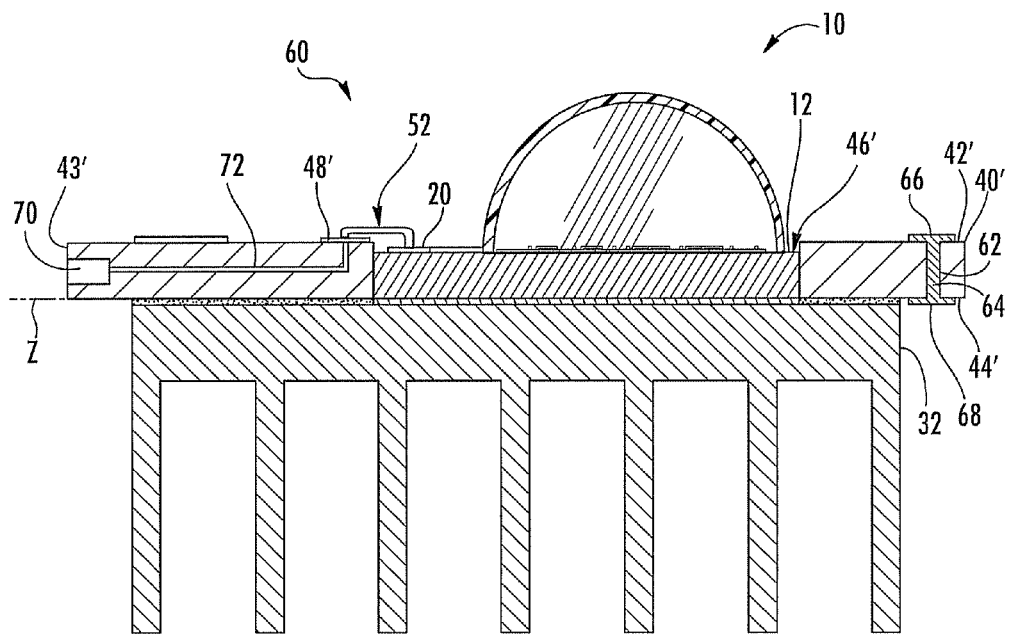
FIG. 3 illustrates a perspective view of another embodiment of a lamp assembly according to the present subject matter.

To position the light-emitting diode package 10 and facilitate the securing of the package 10 in place relative to the printed circuit board 40, the substrate 12 of the light-emitting diode package 10 can engage the opening 46 of the printed circuit board 40 to provide a mechanical coupling of the light-emitting diode package 10 to the printed circuit board 40. The mechanically coupling can assist in holding the substrate 12 the light-emitting diode package 10 relative to the printed circuit board 40 so that the electrical contacts 48 of the printed circuit board 40 can be closely aligned with the electrical contacts 20 of the light-emitting diode package 10. For example, the top surface 14 of the substrate 12 can be substantially flush with the face surface 42 of the printed circuit board 40. In some embodiments, the bottom surface 16 of the substrate 12 can be substantially flush with the rear surface 44 of the printed circuit board 40 so that the bottom surface 16 and the rear surface 44 are aligned and disposed along a common plane Z (as shown in FIG. 3). In some embodiments, the top surface 14 and the bottom surface 16 of the substrate 12 can be substantially flush with the face surface 42 and rear surface 44 of the printed circuit board 40, respectively. In such embodiments, the top surface 14 of the substrate 12 and the face surface 42 can be aligned along a common plane and the bottom surface 16 of the substrate 12 and the rear surface 44 can be aligned along a different common plane.

The mechanically coupling of the light-emitting diode package 10 to the printed circuit board 40 can be accomplished in different manners. For example, as shown in FIGS. 2A-2C, the shape of the opening 46 in the printed circuit board 40 can matchingly correspond to the shape of the substrate 12 of the light-emitting diode package 10.

As shown in FIGS. 2A-2C, the opening 46 can have a rectangular shape that corresponds to the rectangular shape of the substrate 12 of the light-emitting diode package 10. In particular, the opening 46 can have a length $L_O$ and a width $W_O$, while the substrate 12 can have a length $L_S$ and a width $W_S$. The length $L_O$ of the opening 46 can be substantially similar to the length $L_S$ of the substrate 12. The width $W_O$ of the opening 46 can be substantially similar to the width $W_S$ of the substrate 12. For example, the length $L_O$ and width $W_O$ of the opening 46 can be close enough in measurement to the length $L_S$ and width $W_S$ of the substrate 12 that the sides 28 of the substrate 12 contact the inner walls 47 of the opening 46 to create an engagement. In this manner, the sides 28 of the substrate 12 of the light-emitting diode package 10 frictionally engage inner walls 47 of the printed circuit board 40 defining the opening 46. The shapes of both the opening 46 of the printed circuit board 40 and the substrate 12 of the of the light-emitting diode package 10 can be other shapes such as circular, triangular, asymmetrical, or the like.

The printed circuit board 40 can have a height $H_C$ that is also substantially similar to a height $H_S$ of the substrate 12 of the light-emitting diode package 10. The height $H_C$ of the printed circuit board 40 can also be greater than height $H_S$ of the substrate 12. In other embodiments, the height $H_S$ of the substrate 12 can be greater than the height $H_C$ of the printed circuit board 40. When the substrate 12 of the light-emitting diode package 10 fully engages the opening 46 of the printed circuit board 40 as shown in FIG. 2B, the electrical contacts 48 of the printed circuit board 40 can be aligned with the top mount electrical contacts 20 of the light-emitting diode package 10. The mechanical coupling of the light-emitting diode package 10 to the printed circuit board 40 can allow for a solderless electrical connection.

By having the electrical contacts 48 of the printed circuit board 48 disposed on the face surface 42 of the printed circuit board 40 and aligned with the top mounted electrical contacts 20 of the light-emitting diode package 10, the electrical connection between the printed circuit board 40 and the light-emitting diode package 10 can be made with bare wires 52 that can be reflowed by point contact with each of the electrical contacts 20, 48, respectively. Thereby, electrical connection between the electrical contacts 48 of the printed circuit board and the electrical contacts 30 of the light-emitting diode package 10 can be accomplished easily and quickly. After reflow, the wires 52 and the electrical contacts 20, 48 can be encapsulated with an encapsulation material to protect the electrical connection.

Such an embodiment of a lamp assembly 30 can, therefore, be easily and quickly constructed through the mechanical coupling of the light-emitting diode package 10 to the printed circuit board 40 and the contact point reflow of the wires 52 to the respective electrical contacts 20, 48.

As shown in FIGS. 2A-2C, the printed circuit board 40 and the heat sink 32 can have a gap fill material 54 placed therebetween to insulate the printed circuit board 40. The gap fill material 54 can also be thermally conductive to facilitate the transfer of heat from the printed circuit board 40 to the heat sink 32. Further, in some instances, the gap fill material 54 can also help secure the printed circuit board 40 to the heat sink 32. The gap fill material can be, for example, a thermally conductive epoxy.

While not shown in FIGS. 2A-2C, it is noted that the printed circuit board 40 can be secured to the heat sink 32 in other manners as well. For example, the printed circuit board and the heat sink each can include one or more securement holes that are alignable with each other. One or more attachment devices can then be inserted into the aligned securement holes to hold the printed circuit board to the heat sink. Such attachment devices can include, for example screws, bolts, rivets, or the like. By securing of the printed circuit board 40 and the heat sink 32 together, the light-emitting diode package 10 can be held in position relative to the printed circuit board 40 within the lamp assembly.

FIG. 3 shows another embodiment of a lamp assembly 60 that is similar in construct and operation to the lamp assembly 30 illustrated in FIGS. 2A-2C. Therefore, not all of the features are labeled and described. In particular, the lamp assembly 60 can include a printed circuit board 40' and a light-emitting diode package 10 mounted on a heat sink 32. The substrate 12 of the light-emitting diode package 10 can engage the opening 46' of the printed circuit board 40' so that the bottom surface 16 of the substrate 12 of the light-emitting diode package 10 and the face surface 42' of the printed circuit board 40' can be disposed along a common plane Z. The electrical connection between the printed circuit board 40' and the light-emitting diode package 10 can be made with bare wires 52 that can be reflowed by point contact with each of the electrical contacts 20, 48', respectively.

The printed circuit board 40' can include via holes 62 that can be filled with thermally conductive material 64 to facilitate the removal of heat from the printed circuit board 40'. A top plate 66 of the same or different thermally conductive material can be placed on the face surface 42' of the printed circuit board 40' and/or a bottom plate 68 of the same or different thermally conductive material can be placed on the rear surface 44' of the printed circuit board 40'. The top and bottom plates 66, 68 can also further aid in the remove of heat from the printed circuit board 40'. Such thermally conductive material can be thermally conductive plastic or thermally conductive metals, such as copper, silver, aluminum, tin, gold, etc.

The embodiment shown in FIG. 3 can also include a female receptacle contact 70 that is located in a side 43' of the printed circuit board 40' and is electrically connected to the electrical contact 48' through a lead line 72. In this manner, the connection with the housing or lighting fixture in which the lamp assembly 60 will be used can be made by plugging a male insert contact in a female receptacle contact 70.

Figure 4A:
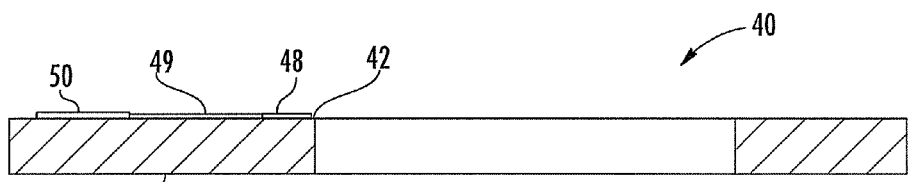
FIGS. 4A-4C illustrate vertical cross-sectional views of embodiments of circuit boards that can be included in lamp assemblies according to the present subject matter.
Figure 4B:
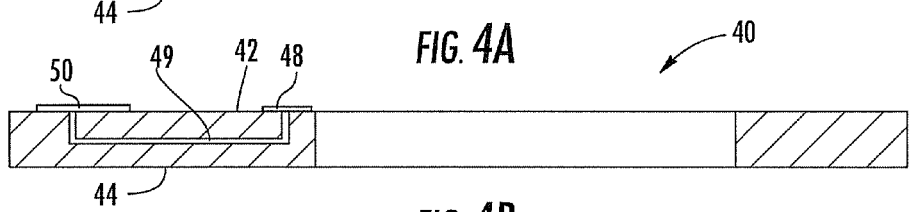
Figure 4C:
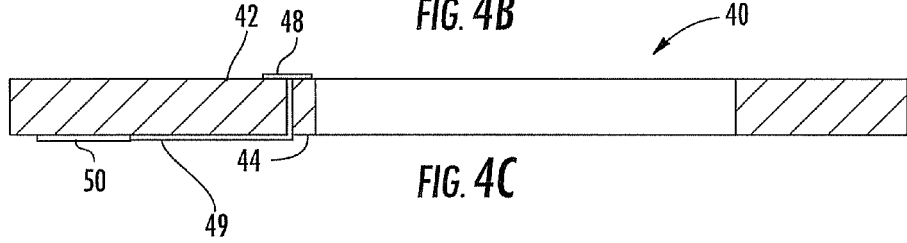

FIGS. 4A-4C illustrate different positions of lead lines 49 that connect electrical contacts 48 with larger contacts 50 in a circuit board 40. As shown in FIG. 4A, both the electrical contacts 48 and the larger contacts 50 can reside on the face surface 42 of the printed circuit board 40 with the lead lines 49 also residing on the face surface 42. As shown in FIG. 4B, both the electrical contacts 48 and the larger contacts 50 can reside on the face surface 42 of the printed circuit board 40. The lead line 49, however, can run through the middle of the printed circuit board 40. As shown in FIG. 4C, the electrical contacts 48 can reside on the face surface 42 of the printed circuit board 40 and the large contacts 50 can reside on the rear surface 44 of the printed circuit board 40. The lead lines 49 can also reside on the rear surface 44 of the printed circuit board 40. Any combination of the electrical contacts 48, the larger contacts 50 and the lead lines 49 is possible.

Figure 8A:
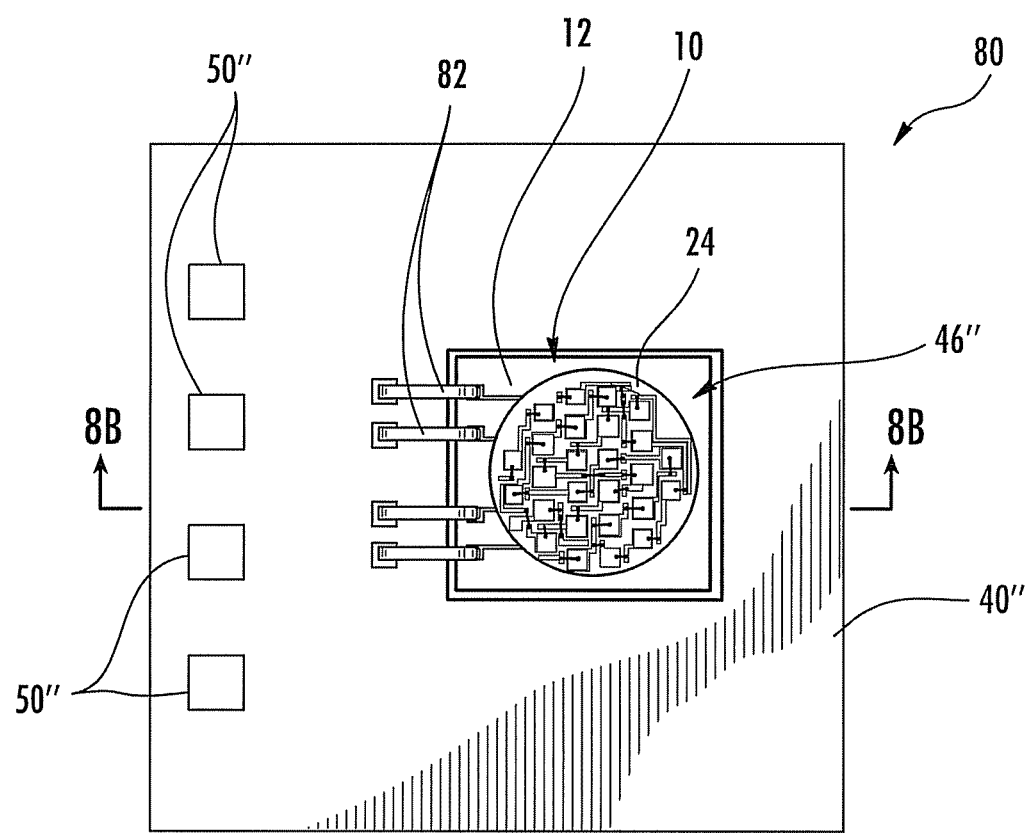
FIG. 8A illustrates a top view of a portion of another embodiment of a lamp assembly according to the present subject matter.

FIGS. 8A-9B also illustrate embodiments of lamp assemblies similar in construction to the lamp assembly 30 shown in FIGS. 2A-2C. Again, due to the similarities, not all of the features are labeled and described. FIGS. 8A and 8B illustrate a lamp assembly, generally designated 80, that can include a light-emitting diode package 10 mounted on a heat sink 32 and a printed circuit board 40". The substrate 12 of the light-emitting diode package 10 can engage an opening 46" of the printed circuit board 40" so that a top surface 14 of a substrate 12 of the light-emitting diode package 10 can be substantially flush with a face surface 42" of the printed circuit board 40". The electrical contacts of the printed circuit board 40" can comprise spring contacts 82 that are disposed on the face surface 42" of the printed circuit board 40" and extend into the opening 46" of the printed circuit board 40" when the printed circuit board 40" is not engaging the light-emitting diode package 10. In such an embodiment, the electrical connection between the printed circuit board 40" and the light-emitting diode package 10 can be made by contact of the spring contacts 82 of the printed circuit board 40" and the electrical contacts 20 of the light-emitting diode package 10. Since the spring contacts 82 are biased toward the contacts 20 of the light-emitting diode package 10, the force of the spring contacts 82 can make an electrical connection with the electrical contacts 20 of the light-emitting diode package 10 without the use of solder and/or reflow.

Figure 8B:
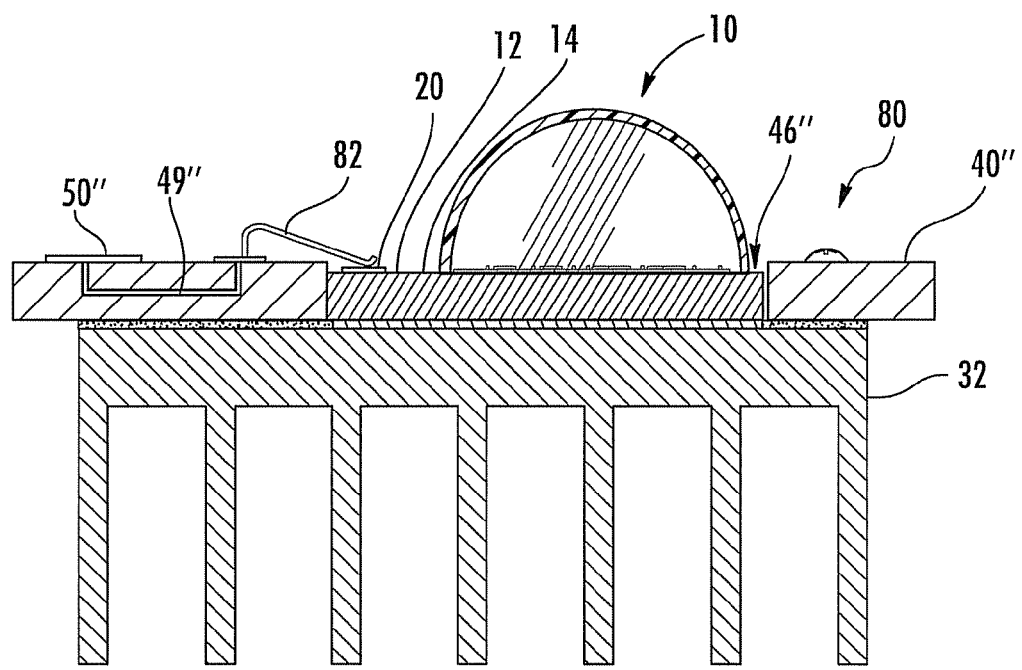
FIG. 8B illustrates a vertical cross-sectional view of the embodiment of the lamp assembly shown in FIG. 8A.
Figure 9A:
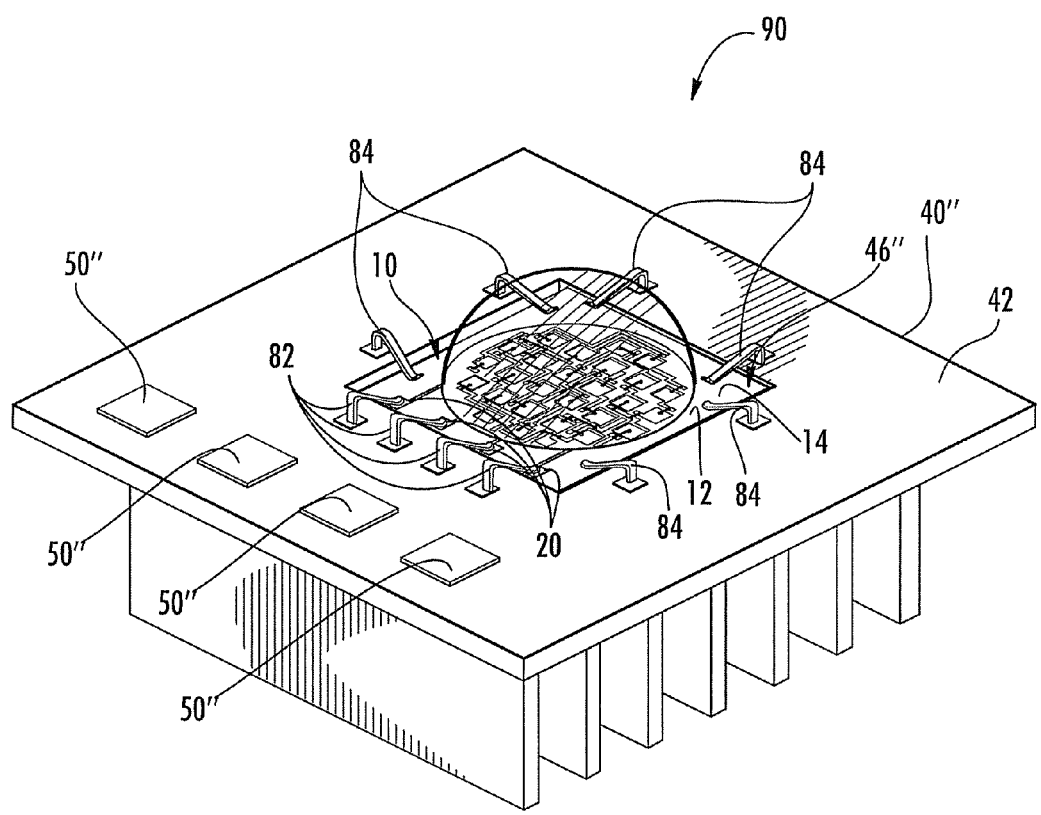
FIG. 9A illustrates a top view of a portion of a further embodiment of a lamp assembly according to the present subject matter.
Figure 9B:
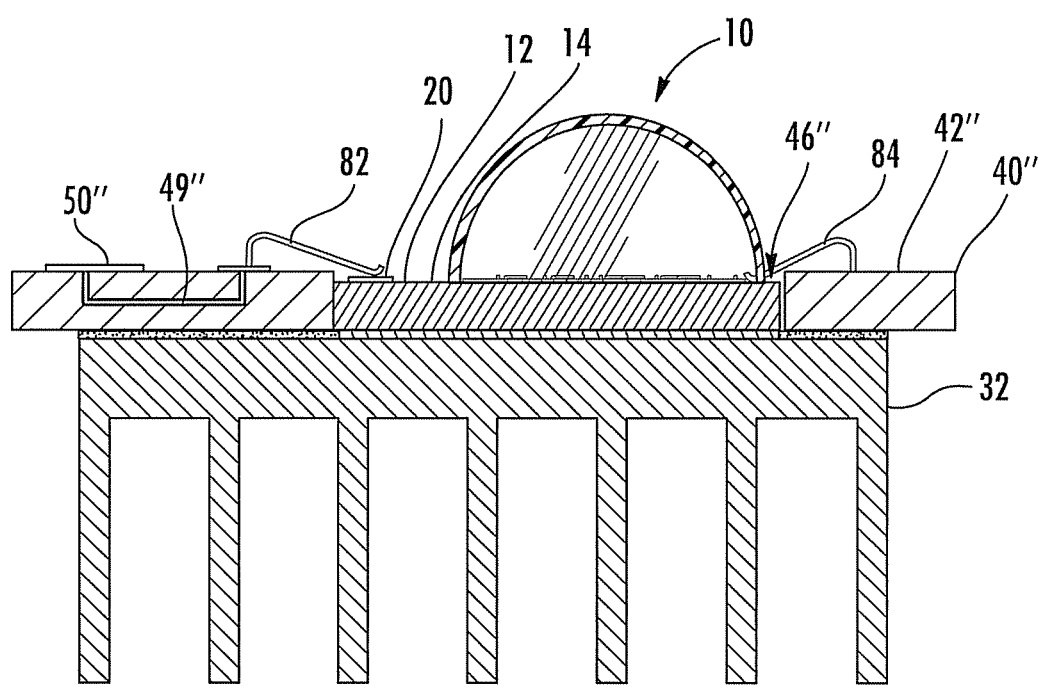
FIG. 9B illustrates a vertical cross-sectional view of the embodiment of the lamp assembly shown in FIG. 9A.

FIGS. 9A and 9B illustrate another embodiment of a lamp assembly, generally designated 90, that is similar to the lamp assembly 80 illustrated in FIGS. 8A and 8B. Again, a lamp assembly 90 can include a light-emitting diode package 10 mounted on a heat sink 32 and a printed circuit board 40". The substrate 12 of the light-emitting diode package 10 can engage an opening 46" of the printed circuit board 40" so that a top surface 14 of a substrate 12 of the light-emitting diode package 10 can be substantially flush with a face surface 42" of the printed circuit board 40". The electrical connection between the printed circuit board 40" and the light-emitting diode package 10 can be made by contact of the spring contacts 82 of the printed circuit board 40" and the electrical contacts 20 of the light-emitting diode package 10 as shown in FIGS. 8A and 8B.

As shown in FIGS. 9A and 9B, the printed circuit board 40" can also include one or more spring clips 84 that are disposed on the face surface 42 of the printed circuit board 40" and extend into the opening 46" of the printed circuit board 40" when the printed circuit board 40" is not engaging the light-emitting diode package 10. The bias of the spring clips 84 can facilitate holding the light-emitting diode package 10 in the opening 46" of the printed circuit board 40" and in position relative to the printed circuit board 40" to insure proper alignment of the spring contacts 82 of the printed circuit board 40" and the electrical contacts 20 of the light-emitting diode package 10. In such an embodiment, the light-emitting diode package 10 can be placed on either the heat sink 32 or a thermal conductive pad 38 on the heat sink 32, but not secured to the heat sink 32. The spring clips 84 can also be used to hold the light-emitting diode package 10 in position in corporation with the inner walls 47 of the opening 46 (see FIG. 2C) and the thermal conductive pad 38.

Figure 5A:
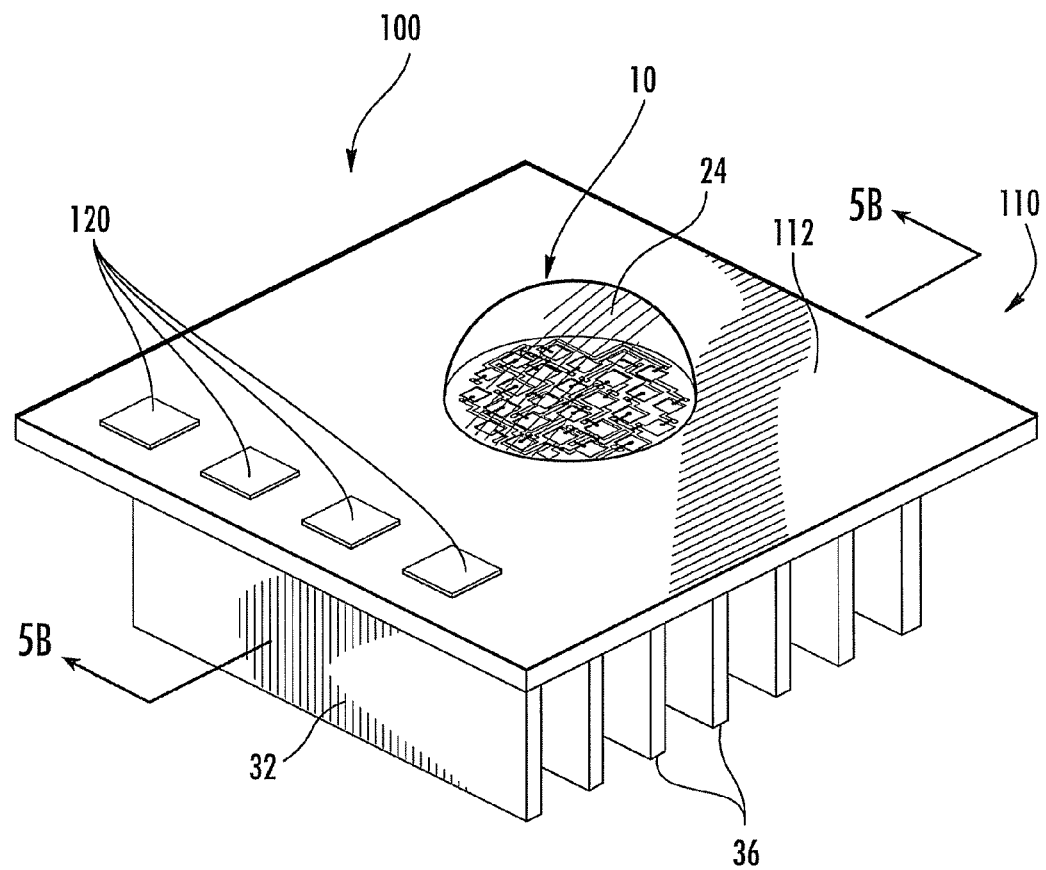
FIG. 5A illustrates a perspective view of a further embodiment of a lamp assembly according to the present subject matter.
Figure 5B:
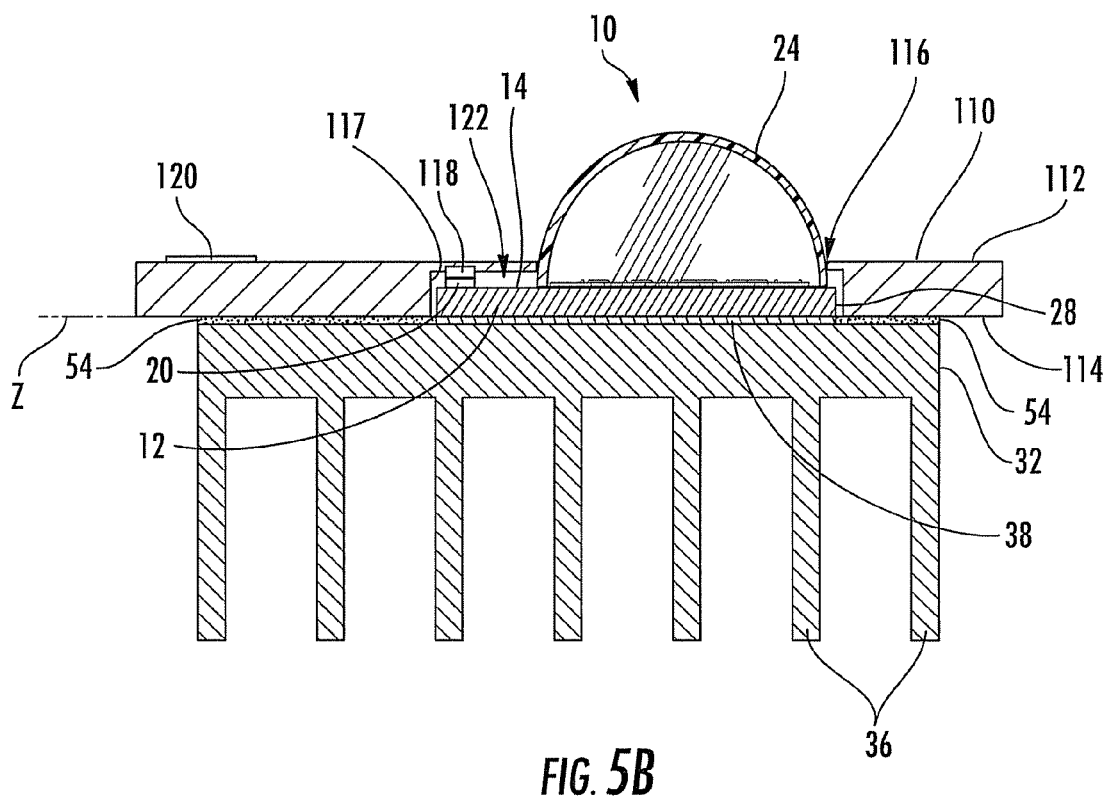
FIG. 5B illustrates a vertical cross-sectional view of the embodiment of the lamp assembly shown in FIG. 5A taken along the line 5B-5B.
Figure 5C:
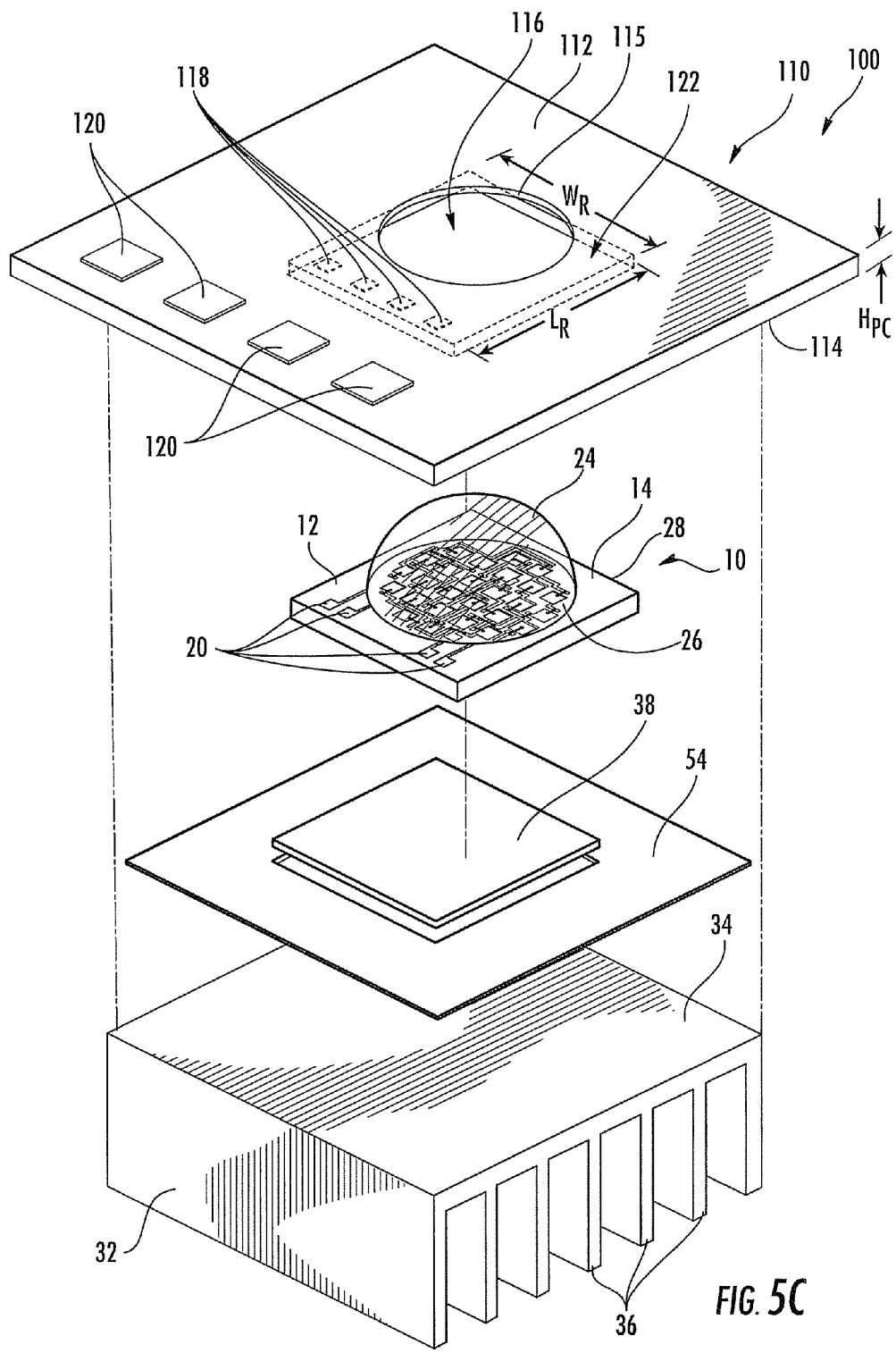
FIG. 5C illustrates an exploded view of the embodiment of the lamp assembly shown in FIG. 5A.

Another embodiment of a lamp assembly, generally designated as 100, is shown in FIG. 5A-5C. The lamp assembly 100 is in some respects similar to the lamp assembly 30 shown in FIGS. 2A-2C. The lamp assembly 100 shown in FIGS. 5A-5C can include a light-emitting diode package 10 mounted on a heat sink 32 and a printed circuit board 110. The heat sink 32 can include a top surface 34 on which the light-emitting diode package 10 can be secured. The heat sink 32 can also include fins 36 to facilitate heat dissipation. The fins 36 can be spaced apart to facilitate air flow around the fins 36. The light-emitting diode package 10 can be secured to the heat sink 32 in different ways. For example, the substrate 12 of the light-emitting diode package 10 can be mounted to the heat sink 32 with a thermally conductive compound 38. By directly mounting the light-emitting diode package 10 to the heat sink 32 using thermally conductive compound 38, heat can be transferred away from light-emitting diode package 10 and the printed circuit board 110 without having to transfer the heat through the printed circuit board 110. As in the embodiments described above, having the electrical contacts 20 on the top surface 14 of the substrate 12 and directly mounting the light-emitting diode package 10 to the heat sink 32 also increases the manufacturability of the lamp assembly 30.

The printed circuit board 110 can have a face surface 112 and a rear surface 114 (see FIG. 5B) opposite the face surface 112. The printed circuit board 110 can define an opening 116 that extends through both the face surface 112 and the rear surface 114. The opening 116 is large enough to receive the base 26 of the lens 24. The rear surface 114 of the circuit board 110 can further include a recess 122. The recess 122 can be large enough to receive the substrate 12 of the light-emitting diode package 10. Further, the recess 122 aligns with the opening 116 such that placement of the opening 116 in relation to the recess 122 permits the substrate 12 of the light-emitting diode package 10 to reside in the recess 122 and the lens 24 to extend through the opening 116.

The printed circuit board 110 can also include electrical contacts 118 that reside in the recess 122, which will be described in more detail below. Further, the printed circuit board 110 can include large contacts 110, for example, solder pads, for connecting the lamp assembly 100 to the housing or lighting fixture in which it will be used.

The shape of the opening 116 through the face surface 112 of the printed circuit board 110 can correspond in a matching manner to the shape of a base 26 of the lens 24 of the light-emitting diode package 10. The upper walls 115 of the opening 116 and the base 26 of the lens 24 can contact each other to create a frictional engagement. Alternatively, the opening 116 can fit loosely around the base 26 of the lens 24. For example, the diameter of the opening 116 between the upper walls 115 can be larger than or substantially similar to the diameter of the base 26 of the lens 24.

The recess 122 on the rear surface 114 of the printed circuit board 110 can also matchingly correspond to the shape of the substrate 12 of the light-emitting diode package 10. Alternatively, the recess 122 on the rear surface 114 of the printed circuit board 110 can have a shape and size that is larger than the shape of the substrate 12 of the light-emitting diode package 10.

As shown in FIGS. 5A-5C, the recess 122 can have a rectangular shape that can correspond to the rectangular shape of the substrate 12 of the light-emitting diode package 10. In particular, the recess 122 can have a length $L_R$ and a width $W_R$, while the substrate 12 can have a length $L_S$ and a width $W_S$ (as shown in FIG. 2A). The length $L_R$ and width $W_R$ of the recess 122 can be substantially similar to the length $L_S$ and width $W_S$ of the substrate 12. For example, the length $L_R$ and width $W_R$ of the recess 122 can be close enough in measurement to the length $L_S$ and width $W_S$ of the substrate 12 that the sides 28 of the substrate 12 contact the inner walls 117 of the recess 122 to create an engagement. In this manner, the sides 28 of the substrate 12 of the light-emitting diode package 10 can frictionally engage inner walls 117 of the printed circuit board 110 defining the recess 122. The shapes of both the recess 122 and the substrate 12 of the of the light-emitting diode package 10 can be other shapes such as circular, triangular, asymmetric, or the like.

Alternatively, the length $L_R$ and width $W_R$ of the recess 122 can be larger than the length $L_S$ and width $W_S$ of the substrate 12. In such an embodiment, the engagement of the printed circuit board 110 to the heat sink 32 can be used to hold the light-emitting diode package 10 in position within the lamp assembly 100 as described below. Having an opening 116 that is smaller than the substrate 12 of the light-emitting diode package 10 can prevent the substrate 12 from passing therethrough. Thus, if the printed circuit board 110 is secured to the heat sink 32, the light-emitting diode package 10 can be sandwiched between the printed circuit board 110 and the heat sink 32. In this manner, the light-emitting diode package 10 can be held in position.

As shown in FIG. 5C, the printed circuit board 110 can have a height $H_{PC}$. The height $H_{PC}$ can be greater than the height $H_S$ (see FIG. 2C) on the substrate 12 of the light-emitting diode package 10. Thus, when the substrate 12 of the light-emitting diode package 10 fully engages the recess 122 of the printed circuit board 110 as shown in FIG. 5B, the substrate 12 of the light-emitting diode package 10 can reside in the recess 122 of the printed circuit board 110. In such embodiments, the bottom surface 16 of the substrate 12 can be substantially flush the rear surface 114 of the printed circuit board 110 so that the bottom surface 16 and the rear surface 114 are aligned and disposed along a common plane Z (as shown in FIG. 5C). In other embodiments the bottom surface 16 and the rear surface 44 are not substantially flush.

The top mount electrical contacts 20 of the light-emitting diode package 10 can be aligned with the electrical contacts 118 of the printed circuit board 110 that reside on a top wall 122A of the recess 122. In some embodiments where the printed circuit board 110 is secured tightly to the heat sink 32, the electrical connection can be made by pure contact without having to reflow the contacts 20, 118 and depending on the type of contacts used. Thus, the mechanical coupling of the light-emitting diode package 10 to the printed circuit board 110 can thus provide for a solderless electrical connection.

Figure 6A:
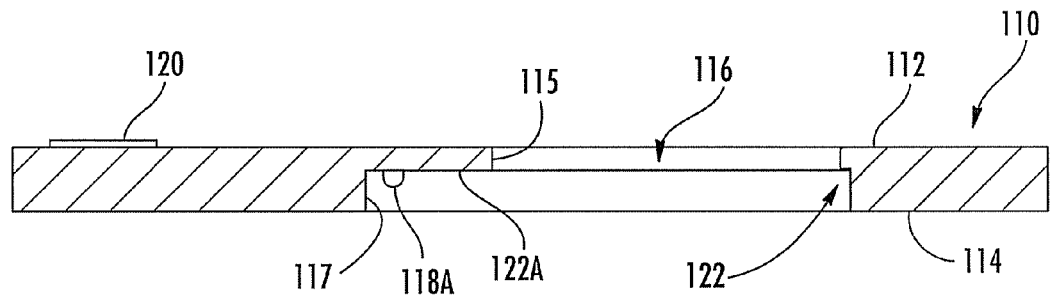
FIGS. 6A-6D illustrate vertical cross-sectional views of portions of embodiments of a circuit board that can be included in lamp assemblies according to the present subject matter.
Figure 6B:
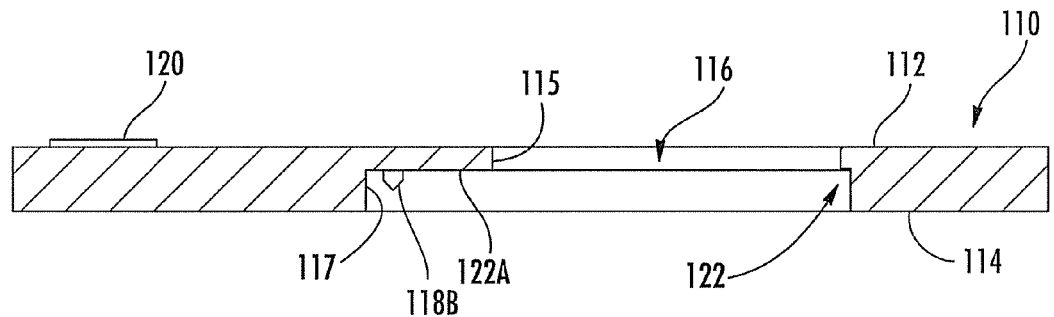
Figure 6C:
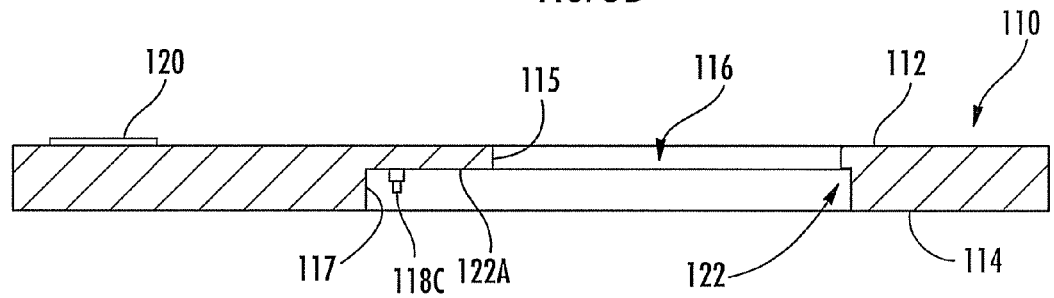
Figure 6D:
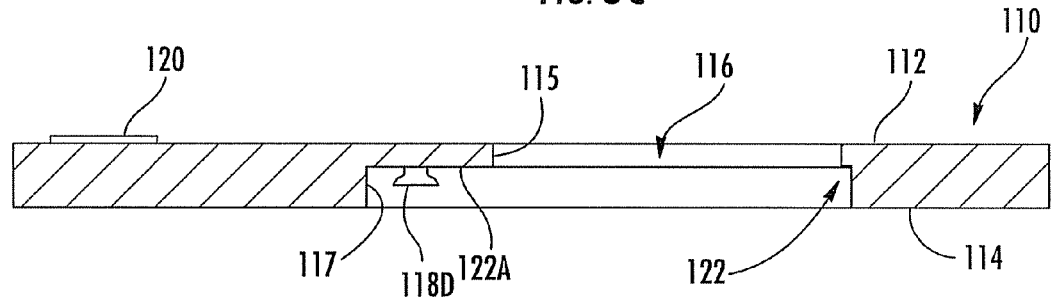

FIGS. 6A-6D illustrate examples of different types of electrical contacts 118 that can, for example, be used in the recess 122 a circuit board 110. As shown in FIG. 6A, the electrical contacts can be ball contacts 118A that can reside on the top wall 122A of recess 122 of the printed circuit board 110. As shown in FIG. 6B, the electrical contacts can be spike contacts 118B that can reside on the top wall 122A of recess 122 of the printed circuit board 110. As shown in FIG. 6C, the electrical contacts can be a pogo pin contacts 118C that can reside on the top wall 122A of recess 122 of the printed circuit board 110. As shown in FIG. 6D, the electrical contacts can be receptacle contacts 118D that can reside on the top wall 122A of recess 122 of the printed circuit board 110. Again, it should be understood that these are example of the different types of electrical contacts that can be used in the recess 122 of the printed circuit board 110. FIGS. 6A-6D also illustrate the upper walls 115 that define the opening 116 through the face surface 112 of the printed circuit board 110 and the inner walls 117 that define the recess 122 in the rear surface 114 of the printed circuit board 110.

As shown in FIGS. 5A-5C, the printed circuit board 110 and the heat sink 32 can have a gap fill material 54 placed therebetween to insulate the printed circuit board 110. The gap fill material 54 can also be thermally conductive to facilitate the transfer of heat from the printed circuit board 110 to the heat sink 32. Further, in some instances, the gap fill material 54 can also help secure the printed circuit board 110 to the heat sink 32. The gap fill material can be, for example, a thermally conductive epoxy.

Figure 7A:
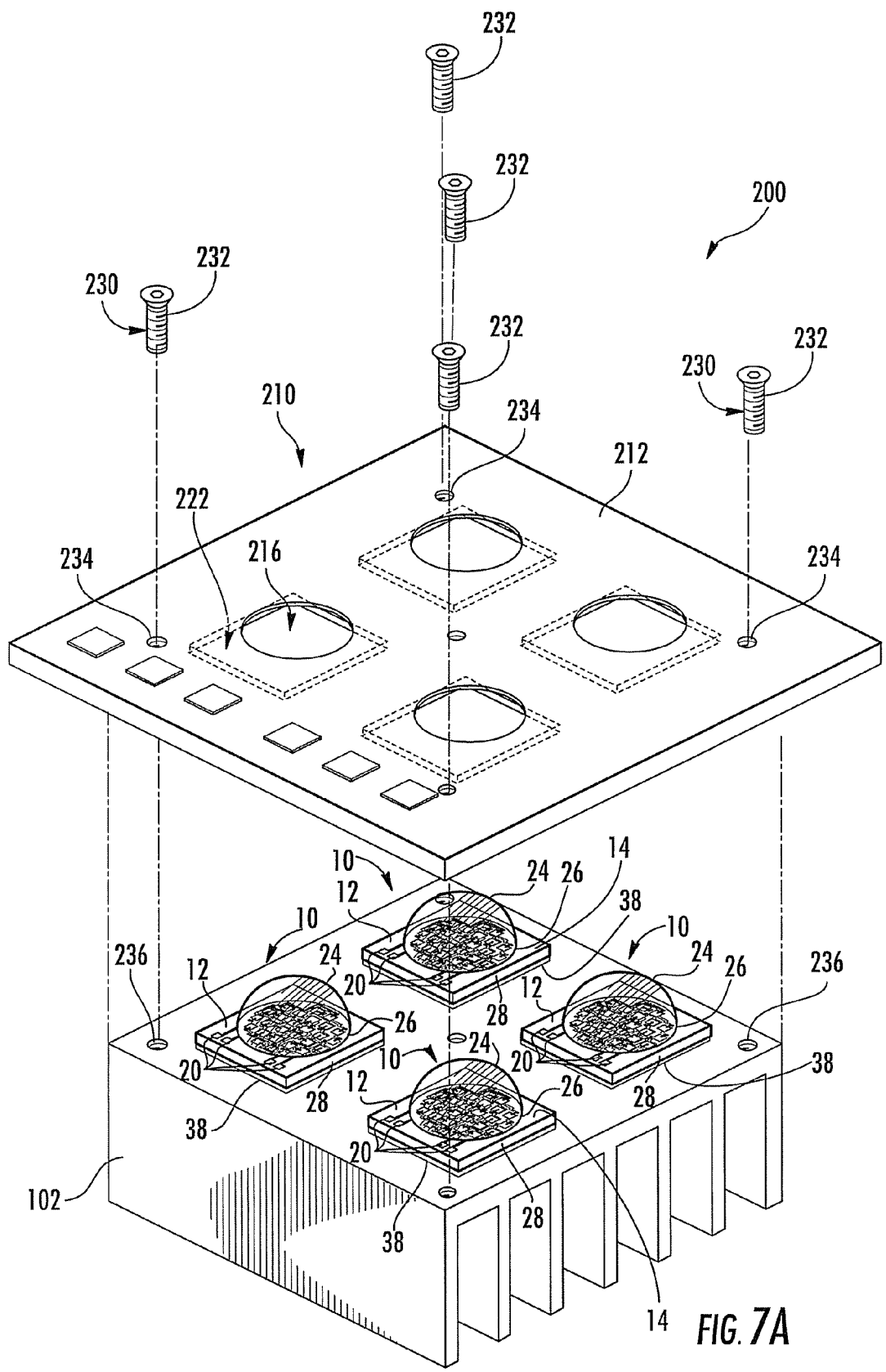
FIG. 7A illustrates a partial exploded view of an additional embodiment of a lamp assembly according to the present subject matter showing placement light-emitting diode packages on a heat sink.
Figure 7B:
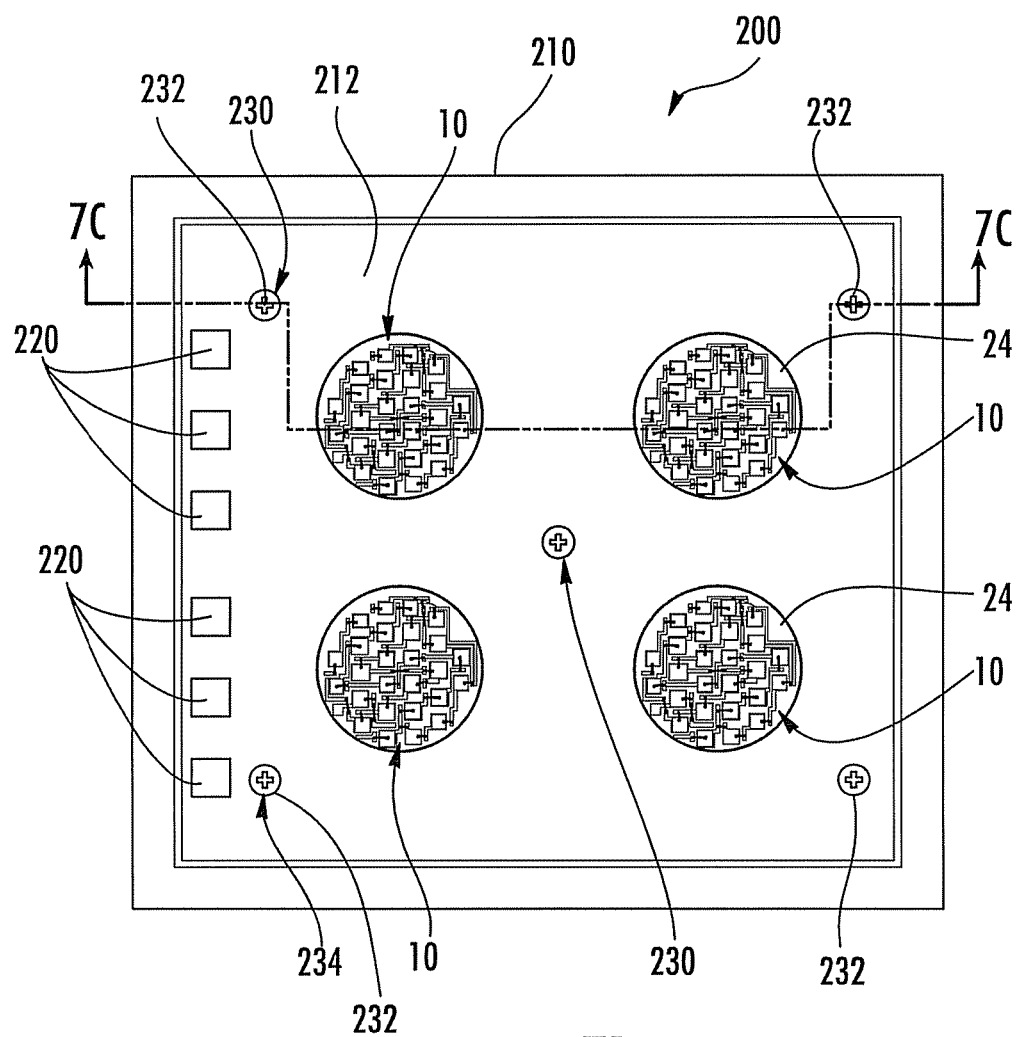
FIG. 7B illustrates a top view of the embodiment of the lamp assembly shown in FIG. 7A.
Figure 7C:
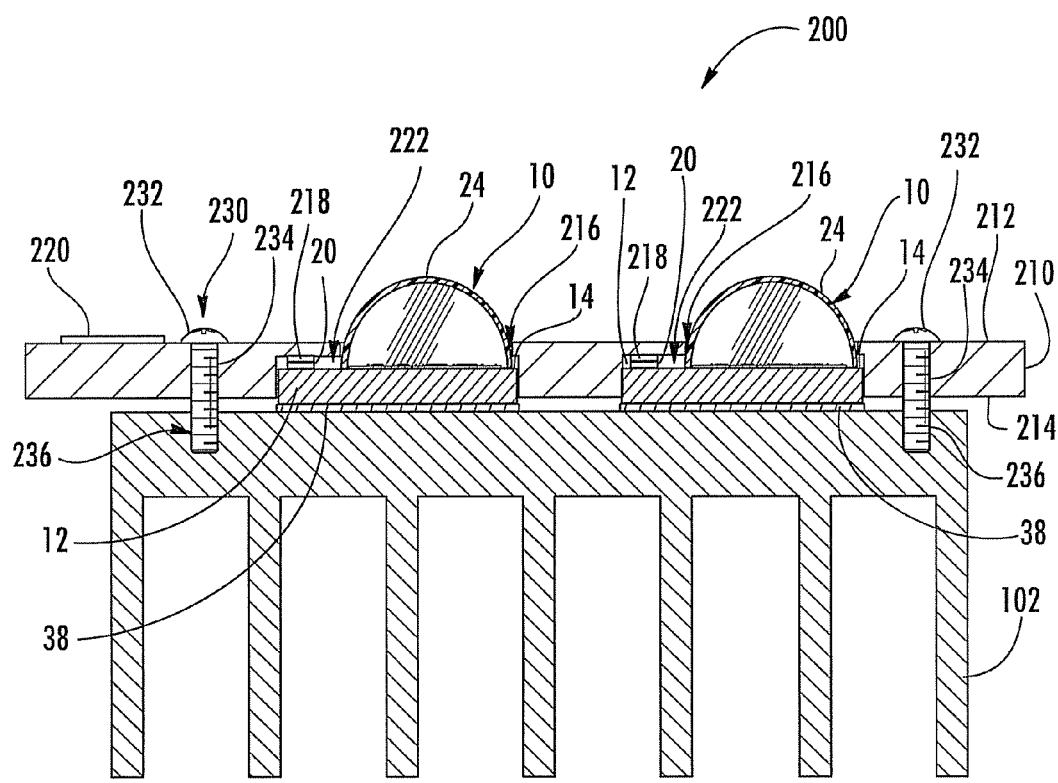
FIG. 7C illustrates a vertical cross-sectional view of the full embodiment of the lamp assembly shown in FIG. 7B taken along the lines 7C-7C.

As shown in FIGS. 7A-7C and described above, the printed circuit board 110 can be secured to the heat sink 32 in ways that permit the securement of the light-emitting diode package 10 in its position and can facilitate the electrical connections between top mount electrical contacts 20 of the light-emitting diode package 10 and the electrical contacts 118 of the printed circuit board 110 mounted in the recess 122. For example, the printed circuit board 110 and the heat sink 32 each can include one or more securement holes that are alignable with each other. One or more attachment devices can then be inserted into the aligned securement holes to hold the printed circuit board to the heat sink. Such attachment devices can include, for example screws, bolts, rivets, or the like.

FIGS. 7A-7C illustrate a further embodiment of a lamp assembly, generally designated 200, that includes a plurality of light-emitting diode packages. For example, the lamp assembly 200 can include a heat sink 102 with a plurality of light-emitting diode packages 10 mounted to the heat sink 102. Each of the light-emitting diode packages 10 includes a lens 24 and a substrate 12 having a top surface 14 and bottom surface 16. The light-emitting diode packages 10 each have electrical contacts 20 only on the top surface 14 of the substrate 12. FIG. 7A shows a plurality of such light-emitting diode packages 10 mounted on heat sink 102. These light-emitting diode packages 10 can be securably mounted to heat sink 102 or can be simply placed on the heat sink 102 with an engagement between the heat sink 102 and a printed circuit board 210 holding the light-emitting diode packages 10 in place. As with the other examples above, the substrates 12 of the light-emitting diode packages 10 can be mounted to the heat sink 102 with a thermally conductive compound 38. The placement of the light-emitting diode packages 10 on heat sink 102 can be determined based on the heat dissipation requirements or goals as well as the expected light output.

The lamp assembly 200 also includes a printed circuit board 210 having a face surface 212 and a rear surface 214 opposite the face surface 212. The printed circuit board 210 can include a plurality of openings extending from the rear surface 214 to the face surface 212 that are alignable with the plurality of light-emitting diode packages 110 on the mounted heat sink 32. Generally, the printed circuit board 210 can have electrical contacts thereon for electrical connection with the electrical contacts 20 of the light-emitting diode packages 10. Each substrate of the light-emitting diode packages 10 can engage in an opening of the plurality of openings of the printed circuit board 210 to mechanical couple of the light-emitting diode packages 10 to the printed circuit board 210. This engagement can provide for a solderless electrical connection.

As noted previously, depending on the type of printed circuit board construction, the shape of the openings in the printed circuit board can matchingly correspond to the shape of the substrates of the light-emitting diode packages (as shown in FIGS. 2A-2C). In such embodiments, sides of the substrates of the light-emitting diode packages can frictionally engage inner walls of the printed circuit board defining the openings therein. As described with regards to FIGS. 2A-2C, the electrical contacts of the printed circuit board can be disposed on the face surface of the printed circuit board. The electrical connection between the printed circuit board and the light-emitting diode packages can be made by wires reflowed wire connection between the electrical contacts of the printed circuit board and the electrical contacts of the light-emitting diode package on a top-side of the lamp assembly.

Similarly, in some embodiments, the electrical contacts of the printed circuit board can include spring contacts as shown in FIGS. 8A-9B that are proximate to the plurality of openings. The electrical connections between the printed circuit board and the light-emitting diode packages can be made by contact of the spring contacts of the printed circuit board and the electrical contacts of the light-emitting diode packages as described above. Further, spring clips can be used in conjunction with a multi-light-emitting diode package lamp assembly in a similar manner as described above.

As shown in FIGS. 7B and 7C, the printed circuit board 210 can have openings 216 through the face surface 212 of the printed circuit board 210 that can matchingly correspond to the positions lenses 24 of the light-emitting diode packages 10. Further, the printed circuit board 210 can include recesses 222 on the rear surface 212 of the printed circuit board 210 that can matchingly correspond to the positions of the substrates 12 of the light-emitting diode packages 10. The electrical contacts 20 of each light-emitting diode package 10 can align and electrically connect with electrical contacts 218 disposed in the recess 222 of the printed circuit board 210. Such an embodiment can be constructed and operate in a similar manner as the lamp assembly 110 using a single light-emitting diode package 10 shown and described with reference to in FIGS. 5A-5C. At least some of each light-emitting diode package 10 can be lined up and connected in series in such embodiments.

As shown in FIGS. 7A-7C, to secure the heat sink 102 and the printed circuit board 210 together, the heat sink 102 can have securement holes 236 therein and the printed circuit board 210 can have securement holes 234 disposed therein. When the printed circuit board is aligned so that the openings 216 align with the lens 24 of the light-emitting diode package 10, the securement holes 234 of the printed circuit board 210 also align with the securement holes 234 of the heat sink 102. Attachment devices 230 can be inserted through the securement holes 234 of the printed circuit board 210 into the securement holes 236 of the heat sink 102 to secure the printed circuit board 210 to the heat sink 102. This measure can also be used to secure the light-emitting diode packages 10 in their intended positions within the lamp assembly 200.

The attachment devices 230 can be, for example, screws 232. The securement holes 234, 236 can be threaded to accept the screw 232. Alternatively, the screw 232 may be a tapping screw and the securement holes 234, 236 may be tappable. Other attachment devices can also be used as outlined above.

Methods of assembling a light-emitting diode lamp assembly can vary depending on the embodiment of the lamp assembly that are described above with reference to the FIGS. 2A-9B. For example, a heat sink and one or more light-emitting diode packages can be provided. As above, each light-emitting diode package can include a substrate having a top surface and bottom surface. Such light-emitting diode package can include a lens and electrical contacts only on the top surface of the substrate. A printed circuit board can also be provided and can have a face surface and a rear surface opposite the face surface. The printed circuit board can also have one or more openings extending from the face surface to the rear surface and electrical contacts thereon. The one or more light-emitting diode packages can be mounted on the heat sink in various manners as described above.

For attaching the printed circuit board, the one or more openings of the printed circuit board can be aligned with the substrates of the one or more light-emitting diode packages. The one or more openings of the printed circuit board can be engaged with the substrates of the one or more light-emitting diode packages to provide a mechanical coupling of the light-emitting diode packages to the printed circuit boards. The configuration of the light-emitting diode package and the printed circuit board can be such that the electrical contacts of the printed circuit board are aligned with the electrical contacts of the light-emitting diode package when the one or more openings of the printed circuit board are engaged with the substrates of the one or more light-emitting diode packages. This engagement can provide for a solderless electrical connection.

In some embodiments, the shapes of the one or more openings in the printed circuit board can matchingly correspond to the shapes of the substrates of the one or more light-emitting diode packages. In such embodiments, the inner walls of the printed circuit board defining the one or more openings therein can be frictionally engaged with sides of the substrates of the light-emitting diode packages.

In some embodiments, the shape of the one or more openings through the face of the printed circuit board matchingly corresponds to the shapes of bases of the lenses of the one or more light-emitting diode packages and the printed circuit board defines one or more recesses on the rear surface of the printed circuit board that matchingly correspond to the shapes of the substrates of the light-emitting diode packages. In such embodiments, the lenses of the one or more light-emitting diode packages can be inserted through the one or more openings and the substrates of the one or more light-emitting diode packages can be received in the one or more recesses of the printed circuit board. In some embodiments, the one or more openings of the printed circuit board can be aligned with the one or more light-emitting diode packages by aligning the lenses of the one or more light-emitting diode packages with the one or more openings of the printed circuit board.

In other embodiments of the method, the printed circuit board can be secured to the heat sink. In some embodiments, the printed circuit board can be secured to the heat sink by aligning one or more securement holes in the printed circuit board with one or more securement holes in the heat sink and inserting attachment devices into the aligned securement holes to hold the printed circuit board to the heat sink. In some embodiments, the light-emitting diode package can be held in position relative to the printed circuit board within the lamp assembly by securement of the printed circuit board and the heat sink together.

Figure 10A:
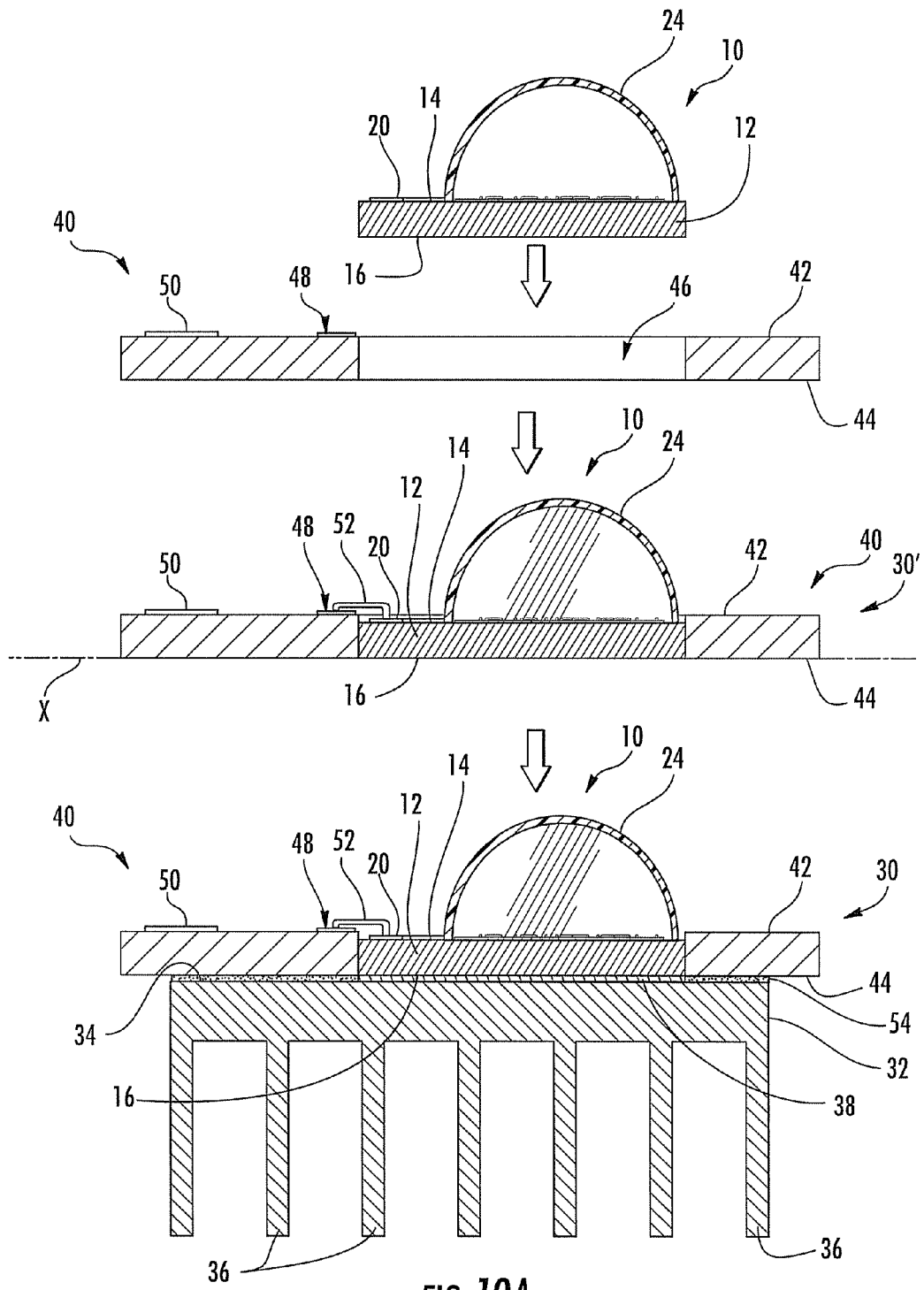
FIG. 10A illustrates a schematic view of steps that can be utilized in assembling one embodiment of a lamp assembly according to the present subject matter.
Figure 10B:
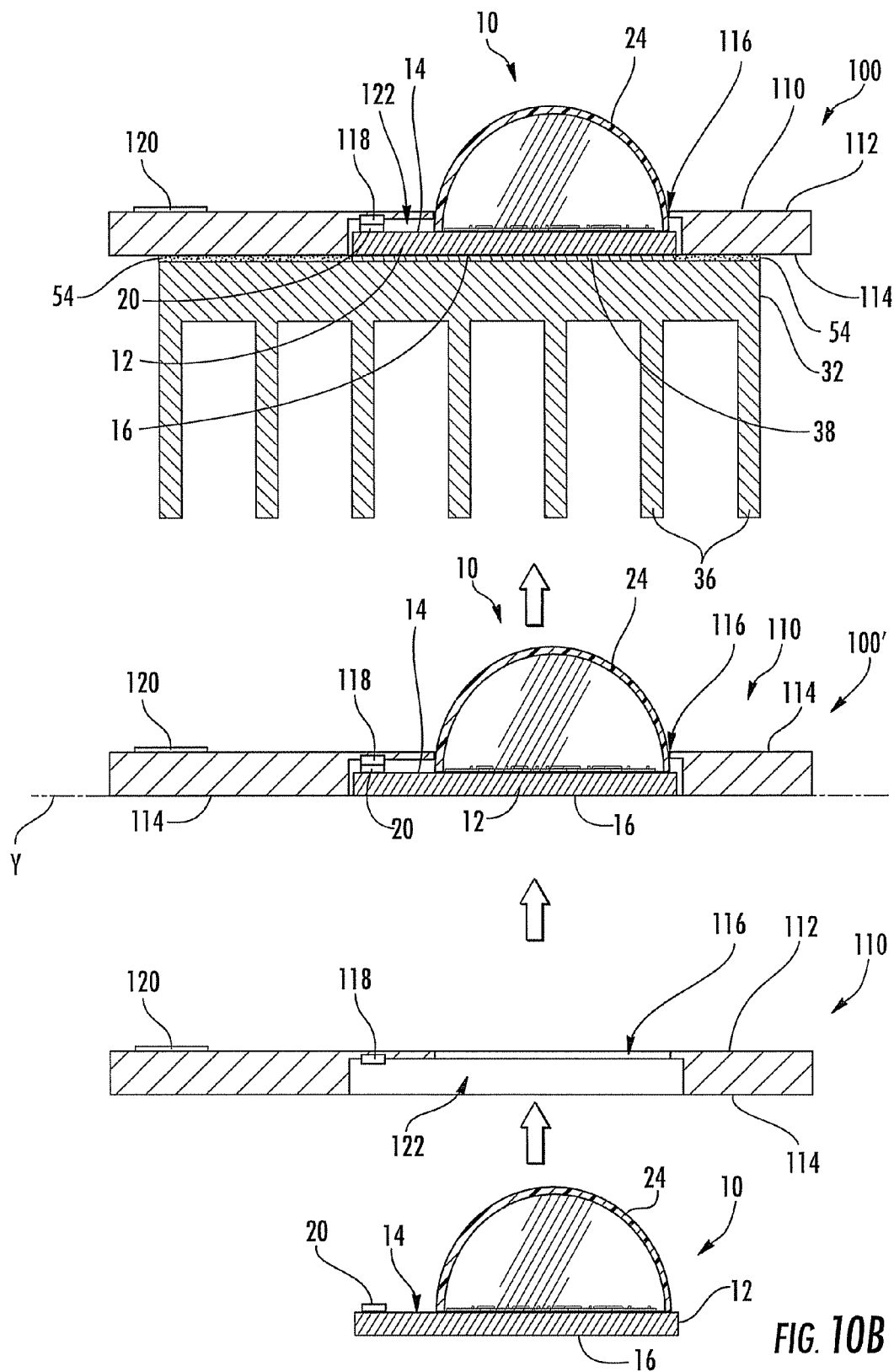
FIG. 10B illustrates a schematic view of steps that can be utilized in assembling another embodiment of a lamp assembly according to the present subject matter.

FIGS. 10A and 10B illustrate other ways of formation of lamp assemblies using one or more light-emitting diode packages and a printed circuit board with one or more openings therein. As shown in FIG. 10A, a light-emitting package 10 can be provided that can include a substrate 12 having a top surface 14 and bottom surface 16, a lens 24, and electrical contacts that can be suitably positioned. Where electrical contacts such as electrical contacts 20 are used, they can be disposed only on the top surface 14 of the substrate 12 as described above. A printed circuit board 40 can be provided that has a face surface 42, a rear surface 44 opposite the face surface 42 and an opening 46 extending from the rear surface 44 to the face surface 42 as described above with reference to FIGS. 2A-2C. In the embodiment shown in FIG. 10A, the light-emitting package 10 can be positioned above or below the printed circuit board 40 so that the substrate 12 of the light-emitting package 10 aligns with the opening 46 of the printed circuit board 40. The light-emitting package 10 can then be inserted into the opening 46 so that the bottom surface 16 of the substrate 12 of the light-emitting diode package 10 is aligned with and disposed along the rear surface 44 of the printed circuit board 40 along a plane X. In this manner, bottom surface 16 of the substrate 12 of the light-emitting diode package 10 can be substantially flush with the rear surface 44 of the printed circuit board 40. The printed circuit board 40 along with the light-emitting package 10 can comprise a lamp assembly 30'. The lamp assembly 30' can be used in different lighting fixtures and can be attached to thermal transfer structures within such lighting fixtures. Also, it is envisioned that configurations of lamp assemblies can be utilized where the bottom surface of the substrate of the light-emitting diode package can be aligned with and disposed along a rear surface of a printed circuit board along the same plane where the electrical connections do not necessarily have to be only on the top surface.

Alternatively, the lamp assembly 30' can be attached to a heat sink 32 to form lamp assembly 30. For example, a thermal transfer compound 38 can be placed between the light-emitting package 10 and the heat sink 32 and the printed circuit board 40 can be secured to the heat sink 32. For instance, attachment devices can be used to secure or anchor the printed circuit board 40 to the heat sink 32, and/or an epoxy can be used between the printed circuit board 40 and heat sink 32.

As shown in FIG. 10B, the light-emitting package 10 can be provided that can include a substrate 12 having a top surface 14, a bottom surface 16 and a lens 24. Electrical contacts can be suitably positioned, and where electrical contacts such as electrical contacts 20 are used, they can be disposed only on the top surface 14 of the substrate 12. The light-emitting package 10 can be inserted into a printed circuit board 110 as described above. Printed circuit board 110 can have a face surface 112 and a rear surface 114. Printed circuit board 110 can also have an opening 116 extending from the rear surface 114 to the face surface 112 as described above with reference to FIGS. 5A-5C. The printed circuit board 110 can also include a recess 122 on the rear surface 114 of printed circuit board 110 that is aligned with and forms a portion of the opening 116. Again, it is envisioned that configurations of lamp assemblies can be utilized where the bottom surface of the substrate of the light-emitting diode package can be aligned with and disposed along a rear surface of a printed circuit board along the same plane where the electrical connections do not necessarily have to be only on the top surface.

In the embodiment shown in FIG. 10B, the light-emitting package 10 can be positioned below the printed circuit board 110 so that the substrate 12 of the light-emitting package 10 aligns with the recess 122 and the lens 24 aligns with the opening 116 of the printed circuit board 40. The lens 24 can then be inserted through the opening 116 with the substrate 12 residing in the recess 122 so that the bottom surface 16 of the substrate 12 of the light-emitting diode package 10 is aligned with and disposed along the rear surface 114 of the printed circuit board 110 along a common plane Y. In this manner, bottom surface 16 of the substrate 12 of the light-emitting diode package 10 can be substantially flush with the rear surface 114 of the printed circuit board 110. The printed circuit board 110 along with the light-emitting package 10 can comprise a lamp assembly 100'. The lamp assembly 100' can be used in different lighting fixtures and can be attached to thermal transfer structures within such lighting fixtures.

Alternatively, the lamp assembly 100' can be attached to a heat sink 32 to form lamp assembly 100. For example, a thermal transfer compound 38 can be placed between the light-emitting package 10 and the heat sink 32 and the printed circuit board 110 can be secured to the heat sink 32. For instance, attachment devices can be used to secure the printed circuit board 110 to the heat sink 32, and/or an epoxy can be used between the printed circuit board 40 and heat sink 32.

Embodiments of the present disclosure shown in the drawings and described above are exemplary of numerous embodiments that can be made within the scope of the appended claims. It is contemplated that the configurations of lamp assemblies and methods of making the same can comprise numerous configurations other than those specifically disclosed.

What is claimed is:

1. A lamp assembly comprising:
a heat sink;
at least one light-emitting diode package mounted to the heat sink, the light-emitting diode package comprising a substrate and electrical contacts;
a board comprising a face surface, a rear surface opposite the face surface and an opening extending from the face surface to the rear surface, the board comprising electrical contacts for electrical connection with the electrical contacts of the light-emitting diode package, and
wherein the substrate of the light-emitting diode package engages one or more inner walls the opening of the board to mechanically couple the light-emitting diode package to the board frictionally via a solderless mechanical connection.

2. The lamp assembly according to claim 1, wherein the substrate of the light-emitting diode package comprises a top surface and a bottom surface.

3. The lamp assembly according to claim 2, wherein the electrical contacts of the light-emitting diode package are disposed only on the top surface of the substrate.

4. The lamp assembly according to claim 1, wherein the substrate of the light-emitting diode package is mounted to the heat sink with a thermally conductive compound.

5. The lamp assembly according to claim 1, wherein a shape of the opening in the board corresponds to a shape of the substrate of the light-emitting diode package.

6. The lamp assembly according to claim 5, wherein lateral sides of the substrate of the light-emitting diode package frictionally engage the one or more inner walls of the board defining the opening therein.

7. The lamp assembly according to claim 1, wherein the board comprises a printed circuit board.

8. The lamp assembly according to claim 1, wherein the substrate of the light-emitting diode package comprises a lens.

9. The lamp assembly according to claim 8, wherein a shape of the opening through the face surface of the board corresponds to a shape of a base of the lens of the light-emitting diode package and the board defines a recess on the rear surface of the board that forms a portion of the opening with the recess corresponding to a shape of the substrate of the light-emitting diode package.

10. The lamp assembly according to claim 9, wherein lateral sides of the substrate of the light-emitting diode package frictionally engage the one or more inner walls of the board defining the recess so that only the lens extends above the face surface of the board.

11. The lamp assembly according to claim 9, wherein the electrical contacts of the board are disposed within the recess of the board and electrical connection between the board and the light-emitting diode package is made by contact between the electrical contacts of the board and the electrical contacts of the light-emitting diode package on a top surface of the substrate of the light-emitting diode package.

12. The lamp assembly according to claim 11, wherein the electrical contacts on the board comprise at least one of pogo pins, solder balls, spikes, and electrical receptacles.

13. The lamp assembly according to claim 1, wherein the board further comprises one or more larger electrical contacts.

14. The lamp assembly according to claim 1, wherein the board comprises one or more via holes with a thermal conductive material running therethrough with a plate of the thermal conductive material being positioned over the via holes on both the face surface and the rear surface of the board.

15. The lamp assembly according to claim 1, wherein the board and the heat sink are secured together.

16. The lamp assembly according to claim 15, wherein the board and the heat sink each comprise one or more securement holes that are alignable with each other and further comprising one or more attachment devices configured for insertion into the aligned securement holes to hold the board to the heat sink.

17. The lamp assembly according to claim 16, wherein the one or more attachment devices are selected from the group consisting of screws, bolts, and rivets.

18. The lamp assembly according to claim 15, wherein the board and the heat sink are secured together by an epoxy placed between the board and the heat sink.

19. The lamp assembly according to claim 15, wherein securement of the board and the heat sink together holds the light-emitting diode package in place relative to the board within the lamp assembly.

20. The lamp assembly according to claim 1, comprising a plurality of light-emitting diode packages mounted to the heat sink and comprising a plurality of openings of the board.

21. The lamp assembly according to claim 1, wherein the electrical contacts of the board are disposed on the face surface of the board and electrical connection between the board and the light-emitting diode package is made by wires reflowed between the electrical contacts of the board and the electrical contacts of the light-emitting diode package on a top-side of the lamp assembly.

22. The lamp assembly according to claim 1, wherein the electrical contacts of the board comprise spring contacts that are disposed on the face surface of the board and extend into the opening of the board, and electrical connection between the board and the light-emitting diode package is made by contact of the spring contacts of the board and the electrical contacts of the light-emitting diode package.

23. The lamp assembly according to claim 22, wherein the board comprises one or more spring clips that are disposed on the face surface of the board and extend into the opening of the board, where the spring clips facilitate retention of the light-emitting diode package in the opening of the board.

24. A lamp assembly comprising:
a light-emitting diode package comprising a substrate with a top surface and bottom surface and electrical contacts on the substrate;
a board comprising a face surface, a rear surface opposite the face surface and at least one opening extending from the rear surface to the face surface that is alignable with at least a portion of the light-emitting diode package, the board comprising electrical contacts thereon for electrical connection with the electrical contacts of the light-emitting diode package; and
wherein the substrate of the light-emitting diode package engages one or more inner walls of the opening of the board to mechanically couple the light-emitting diode package to the board frictionally via a solderless mechanical connection so that the bottom surface of the substrate of the light-emitting diode package aligns along a common plane with the rear surface of the board.

25. The lamp assembly according to claim 24, wherein a shape of the opening in the board corresponds to a shape of the substrate of the light-emitting diode package.

26. The lamp assembly according to claim 25, wherein lateral sides of the substrate of the light-emitting diode package frictionally engage the one or more inner walls of the board defining the opening therein.

27. The lamp assembly according to claim 26, wherein the electrical contacts of the board are disposed on the face surface of the board and electrical connection between the board and the light-emitting diode package is made by wires reflowed between the electrical contacts of the board and the electrical contacts of the light-emitting diode package on a top-side of the lamp assembly.

28. The lamp assembly according to claim 26, wherein the electrical contacts of the board comprise spring contacts that are disposed on the face surface of the board and extend into the opening of the board, and electrical connection between the board and the light-emitting diode package is made by contact of the spring contacts of the board and the electrical contacts of the light-emitting diode package.

29. The lamp assembly according to claim 24, wherein the light-emitting diode package comprises a lens.

30. The lamp assembly according to claim 29, wherein a shape of the opening through the face surface of the board corresponds to a shape of a base of the lens of the light-emitting diode package and the board defines a recess on the rear surface of the board that forms a portion of the opening with the recess corresponding to a shape of the substrate of the light-emitting diode package.

31. The lamp assembly according to claim 30, wherein lateral sides of the substrate of the light-emitting diode package frictionally engage inner walls of the board defining the recess so that only the lens extends above the face surface of the board.

32. The lamp assembly according to claim 30, wherein the electrical contacts of the board are disposed within the recess of the board and electrical connection between the board and the substrate of the light-emitting diode package is made by contact between the electrical contacts of the board and electrical contacts on the top surface of the substrate of the light-emitting diode package.

33. The lamp assembly according to claim 32, wherein the electrical contacts on the board comprise at least one of pogo pins, solder balls, spikes, and electrical receptacles.

34. The lamp assembly according to claim 24, wherein the board comprises a printed circuit board.

35. The lamp assembly according to claim 34, wherein the printed circuit board comprises one or more larger electrical contacts.

36. The lamp assembly according to claim 24, further comprising a heat sink on which the substrate of the light-emitting diode package is attachable.

37. The lamp assembly according to claim 36, wherein the board and the heat sink are secured together.

38. The lamp assembly according to claim 37, wherein the board comprises one or more securement holes and the heat sink comprises one or more securement holes that are alignable with each other and further comprising one or more attachment devices configured for insertion into the aligned securement holes to hold the board to the heat sink.

39. The lamp assembly according to claim 37, wherein the board and the heat sink are secured by an epoxy placed between the board and the heat sink.

40. The lamp assembly according to claim 37, wherein securement of the board and the heat sink together holds the light-emitting diode package in place within the lamp assembly.

41. The lamp assembly according to claim 24, comprising a plurality of light-emitting diode packages mounted to the heat sink and comprising a plurality of openings of the board.

42. The lamp assembly according to claim 24, wherein the substrate of the light-emitting diode package engages the opening of the board to mechanically couple the light-emitting diode package to the board.

43. A lamp assembly comprising:
a heat sink;
a board comprising a face surface, a rear surface opposite the face surface, an opening extending from the face surface to the rear surface, and electrical contacts, at least a portion of the rear face of the board being mounted to the heat sink; and
at least one light emitting diode package having a substrate positioned in the opening of the board and mounted to the heat sink, the at least one light emitting diode package comprising electrical contacts for electrical connection with the electrical contacts of the board, wherein the electrical contacts of the package are only disposed on an upper surface of the substrate and do not extend beyond lateral side walls of the substrate.

\* \* \* \* \*